United States Patent
Tseng et al.

(10) Patent No.: US 9,531,358 B2
(45) Date of Patent: Dec. 27, 2016

(54) SIGNAL GENERATING SYSTEM AND SIGNAL GENERATING METHOD

(71) Applicant: MEDIATEK INC., Hsin-Chu (TW)

(72) Inventors: Sheng-Che Tseng, New Taipei (TW); Yao-Chi Wang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/685,607

(22) Filed: Apr. 14, 2015

(65) Prior Publication Data

US 2016/0118962 A1  Apr. 28, 2016

Related U.S. Application Data

(60) Provisional application No. 62/068,777, filed on Oct. 27, 2014.

(51) Int. Cl.
| | |
|---|---|
| *H03K 3/017* | (2006.01) |
| *H03K 5/06* | (2006.01) |
| *H03K 19/21* | (2006.01) |
| *H03K 5/156* | (2006.01) |

(52) U.S. Cl.
CPC .............. *H03K 5/06* (2013.01); *H03K 5/1565* (2013.01); *H03K 19/21* (2013.01)

(58) Field of Classification Search
CPC ........... H03K 3/017; H03K 5/06; H03K 19/21
USPC ....... 327/113, 117, 175, 291, 299, 355, 357, 327/361
See application file for complete search history.

(56) References Cited

U.S. PATENT DOCUMENTS

| | | | |
|---|---|---|---|
| 5,339,345 A | 8/1994 | Mote, Jr. | |
| 5,552,732 A | 9/1996 | Huang | |
| 6,313,673 B1* | 11/2001 | Watanabe | H03K 21/10 327/115 |
| 6,348,821 B1* | 2/2002 | Schwartz | H03K 5/1565 327/113 |
| 6,882,190 B2 | 4/2005 | Choi | |
| 6,882,229 B1 | 4/2005 | Ho | |
| 7,034,584 B2 | 4/2006 | Choi | |
| 7,272,620 B1* | 9/2007 | Molnar | G06F 7/68 708/103 |
| 7,444,534 B2 | 10/2008 | Panchal | |
| 8,004,320 B2 | 8/2011 | Yang | |
| 8,803,568 B2* | 8/2014 | Leung | H03B 27/00 327/115 |
| 2008/0311860 A1* | 12/2008 | Tanaka | H04B 1/28 455/73 |
| 2012/0313674 A1* | 12/2012 | Malmcrona | H03K 23/425 327/117 |
| 2013/0135016 A1 | 5/2013 | Leung | |

(Continued)

*Primary Examiner* — William Hernandez
(74) *Attorney, Agent, or Firm* — Winston Hsu; Scott Margo

(57) ABSTRACT

A signal generating system for generating an output signal with a 50% duty cycle, comprising: a frequency dividing module, comprising an odd number of level triggering devices, for generating a plurality of frequency divided signals utilizing a frequency dividing ratio equaling to M, wherein the M is an positive integer; and a signal combining module, for combining at least two of the frequency divided signals to generate at least one output combined signal. The signal generating system generates the output signal based on the output combined signal. The frequency dividing module cooperates the signal combining module to provide a frequency dividing ratio equaling to N.5, wherein the N is a positive integer.

25 Claims, 25 Drawing Sheets

(56) References Cited

U.S. PATENT DOCUMENTS

2015/0116011 A1* 4/2015 Atesoglu .............. H03K 5/1565
327/115
2015/0214954 A1* 7/2015 Lifshitz ................ H03K 21/026
326/54

* cited by examiner

SIGNAL GENERATING SYSTEM AND SIGNAL GENERATING METHOD

CROSS REFERENCE TO RELATED APPLICATIONS

This application claims the benefit of U.S. Provisional Application No. 62/068,777, filed on Oct. 27, 2014, the contents of which are incorporated herein by reference.

BACKGROUND

Quadrature signals with accurate duty cycles are always necessary for a circuit. For example, quadrature signals with accurate duty cycles are beneficial for coverage of an oscillator or for frequency planning.

Quadrature signals are commonly used but a conventional signal generating system only uses even-number dividers in order to generate the quadrature signals. Due to the limitation of divider ratio, it is not good for coverage of an oscillator or for frequency planning.

For example, if the signal generating system has 3 level triggering devices, the signal generating system can only generate the frequency divided signal having a phase of 180/3*N. N is a positive integer. For another example, if the signal generating system has 5 level triggering devices, the signal generating system can only generate the frequency divided signal having a phase of 180/5*N. Also, at least one adjusting step is needed to generate desired quadrature signals. However, such adjusting may cause more noises.

Accordingly, a new signal generating system and a new signal generating method are needed.

SUMMARY

Therefore, one objective of the present application is to provide a signal generating system which can generate an output signal with a quadrature phase and odd-number divider ratio via a frequency dividing module, a frequency doubler with 50% duty-cycle outputs and an IQ divider.

Another objective of the present application is to provide a signal generating system which adjusts the duty cycle before the signal is frequency divided to generate I/Q signals.

One embodiment of the present application discloses a signal generating system for generating an output signal with a 50% duty cycle. The signal generating system comprises: a frequency dividing module, comprising an odd number of level triggering devices, for generating a plurality of frequency divided signals utilizing a frequency dividing ratio equaling to M, wherein the M is an positive integer; and a signal combining module, for combining at least two of the frequency divided signals to generate at least one output combined signal. The signal generating system generates the output signal based on the output combined signal. The frequency dividing module cooperates the signal combining module to provide a frequency dividing ratio equaling to N.5, wherein the N is a positive integer.

In one embodiment, N.5=M/2. Also, in one embodiment, the output combined signal is generated by one frequency divided signal and one input clock of the frequency divider module.

Another embodiment of the present application discloses a signal generating system for generating an output signal with a 50% duty cycle. The signal generating system comprises: a frequency dividing module, comprising an odd number of level triggering devices, for generating a plurality of frequency divided signals utilizing a frequency dividing ratio equaling to M, wherein the M is an positive integer; a delay module, for delaying at least one of the frequency divided signal to generated at least one delayed frequency divided signal; and a signal combining module, for combining at least one of the delayed frequency divided signals, or for combining at least one the frequency divided signal and at least one the delayed frequency divided signal, to generate the output signal. The frequency dividing module cooperates the signal combining module to provide a frequency dividing ratio equaling to N.5, wherein the N is a positive integer.

Signal generating methods can be acquired based on above-mentioned embodiments. The steps thereof are omitted for brevity here.

Another embodiment of the present application discloses a duty cycle calibrating circuit, which comprises: a first falling time tuning circuit, for receiving an input signal to generate a first adjusted input signal; and a buffer, for buffering the first adjusted input signal to generate a calibrated signal.

Another embodiment of the present application discloses a duty cycle calibrating circuit, which comprises: a seventh inverter, for receiving an input signal; a second falling time tuning circuit, for receiving output from the seventh inverter to generate a second adjusted input signal; and an eighth inverter, for inverting the second adjusted input signal to generate a calibrated signal.

Another embodiment of the present application discloses a signal combining module, which comprises: a first initial combining circuit, for receiving a plurality of input signals to generate a first output combined signal; a second initial combining circuit, for receiving a plurality of input signals to generate a second output combined signal; a first edge calibrating device, coupled between a first voltage level and the first initial combining circuit; and a second edge calibrating device, coupled between a second voltage level and the second initial combining circuit. The first edge calibrating device and the second edge calibrating device calibrate an edge of the first output combined signal and the second output combined signal to generate an output combined signal at an output terminal.

Another embodiment of the present application discloses a signal combining module, which comprises: an energy storing circuit, coupled to the output terminal; a charging circuit, for receiving at least two input signals to output a charging current to the energy storing circuit; a discharging circuit, for receiving at least two of the frequency divided signals to drain a discharging current from the energy storing circuit. The energy storing circuit generates an output combined signal according to the charging current and the discharging current to the output terminal.

In view of above-mentioned embodiments, an output signal with a quadrature phase and odd-number divider ratio can be generated via a frequency dividing module, a frequency doubler with 50% duty-cycle outputs and an IQ divider. Also, the quadrature phase is adjusted by calibrating the duty cycle of the input signal of the IQ divider, thus the noise can be reduced and phase performance is better.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
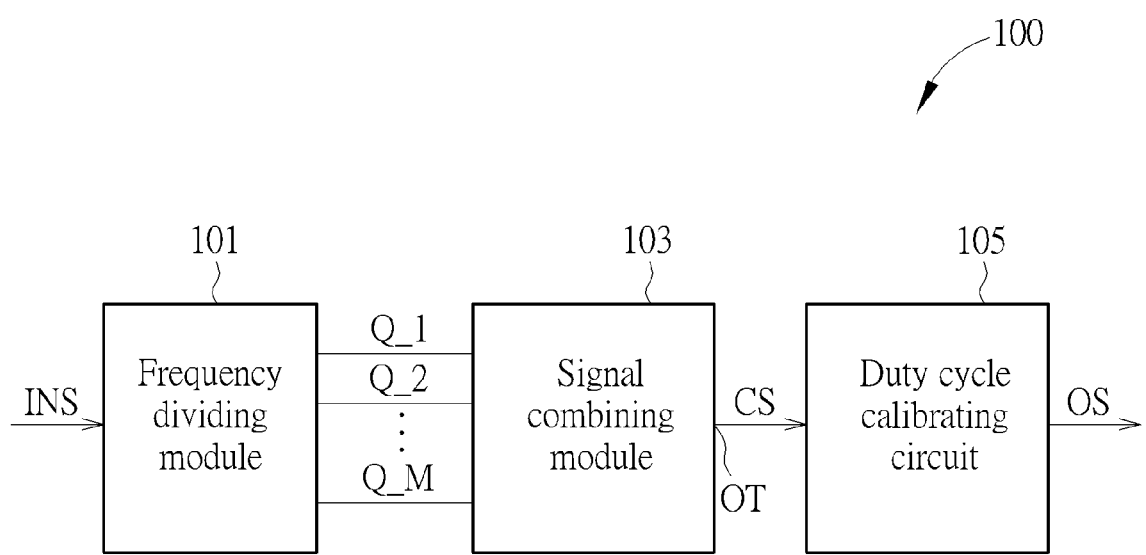
FIG. 1 is a block diagram illustrating a signal generating system according to one embodiment of the present application.

FIG. 1 is a block diagram illustrating a signal generating system 100 for generating an output signal OS with 50% duty cycle according to one embodiment of the present application. As shown in FIG. 1, the signal generating system 100 comprises a frequency dividing module 101, and a signal combining module 103. The frequency dividing module 101 comprises an odd number of level triggering devices, generates a plurality of frequency divided signals Q_1-Q_M utilizing a frequency dividing ratio equaling to M based on the input signal INS, wherein the M is a positive integer. That is, M can be 1, or any other positive integer other than 1. The signal combining module 103 combines at least two of the frequency divided signals Q_1-Q_M to generate an output combined signal CS. In one embodiment, the frequency divided signals Q_1-Q_M have a 50% duty cycle, but frequencies thereof are not desired frequencies. Alternatively, the signal combining module 103 can combine one of the frequency divided signals Q_1-Q_M and the input signal INS to generate the output combined signal CS. The frequency dividing module 101 cooperates with the signal combining module 103 to provide a frequency dividing ratio equaling to N.5, wherein the N is a positive integer. That is, N can be 1, or any other positive integer other than 1. One objective of the present application is to provide an output signal OS with a 50% duty cycle and a desired frequency. Accordingly, if the output combined signal CS already has a 50% duty cycle, the output combined signal CS can directly be output as the output signal OS. Alternatively, the signal generating system 100 can further comprise a duty cycle calibrating circuit 105 for calibrating the output combined signal CS to generate the output signal OS. In one embodiment, the frequency divided signals Q_1-Q_M can be combined and then further processed to generate the output combined signal CS, but not limited.

The detail explaining of the frequency dividing module 101, the signal combining module 103 and the duty cycle calibrating circuit 105 will be discussed later.

Figure 2A:
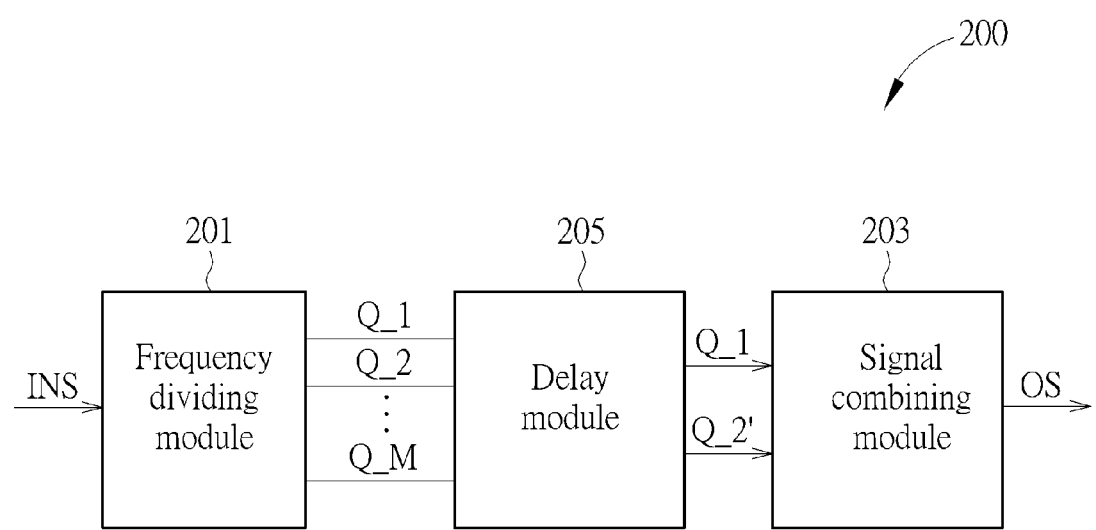
FIG. 2A is a block diagram illustrating a signal generating system according to another embodiment of the present application.

FIG. 2A is a block diagram illustrating a signal generating system 200 for generating an output signal OS with 50% duty cycle according to another embodiment of the present application. The signal generating system 200 comprises a frequency dividing module 201, a signal combining module 203, and a delay module 205. Comparing with the embodiment illustrated in FIG. 1, the signal combining module 103 is provided prior to the duty cycle calibrating circuit 105, but the signal combining module 203 is provided after the delay module 205. Accordingly, at least one of the frequency divided signals Q_1-Q_M is delayed by the delay module 205 to generate at least one delayed frequency divided signal (Q_2' in this example). In such example, the frequency divided signals Q_1 has a 50% duty cycle, and the delayed frequency divided signal Q_2' has a 50% duty cycle as well. Afterwards, the delayed frequency divided signal and the frequency divided signal (or another delayed frequency divided signal) are combined by the signal combining module 203 to generate the output signal OS. After processed by the signal generating system 200, the output signal OS can have a duty cycle for 50% and a desired frequency.

Figure 2B:
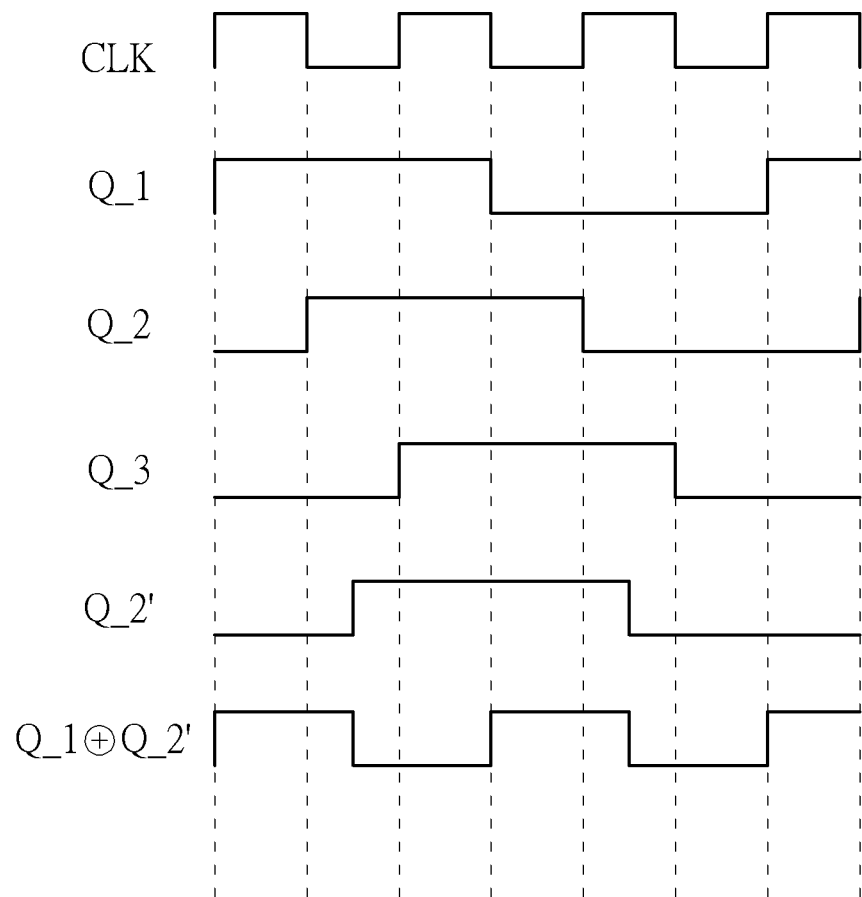
FIG. 2B is a wave chart illustrating the operation for the signal generating system depicted in FIG. 2A.

FIG. 2B is a wave chart illustrating the operation for the signal generating system depicted in FIG. 2A. As illustrated in FIG. 2B, the frequency divided signal Q_2 is delayed by the delay module 205 to generate the delayed frequency divided signal Q_2', and then the frequency divided signal Q_1 and the delayed frequency divided signal Q_2' are combined by the signal combining module 203 to generate the output signal OS (Q_1⊕Q_2').

In one embodiment, the output signal OS can be frequency divided by a frequency dividing ratio 2, but not limited. In such case, the embodiments in FIG. 1 and FIG. 2 form an I/Q divider.

Figure 3:
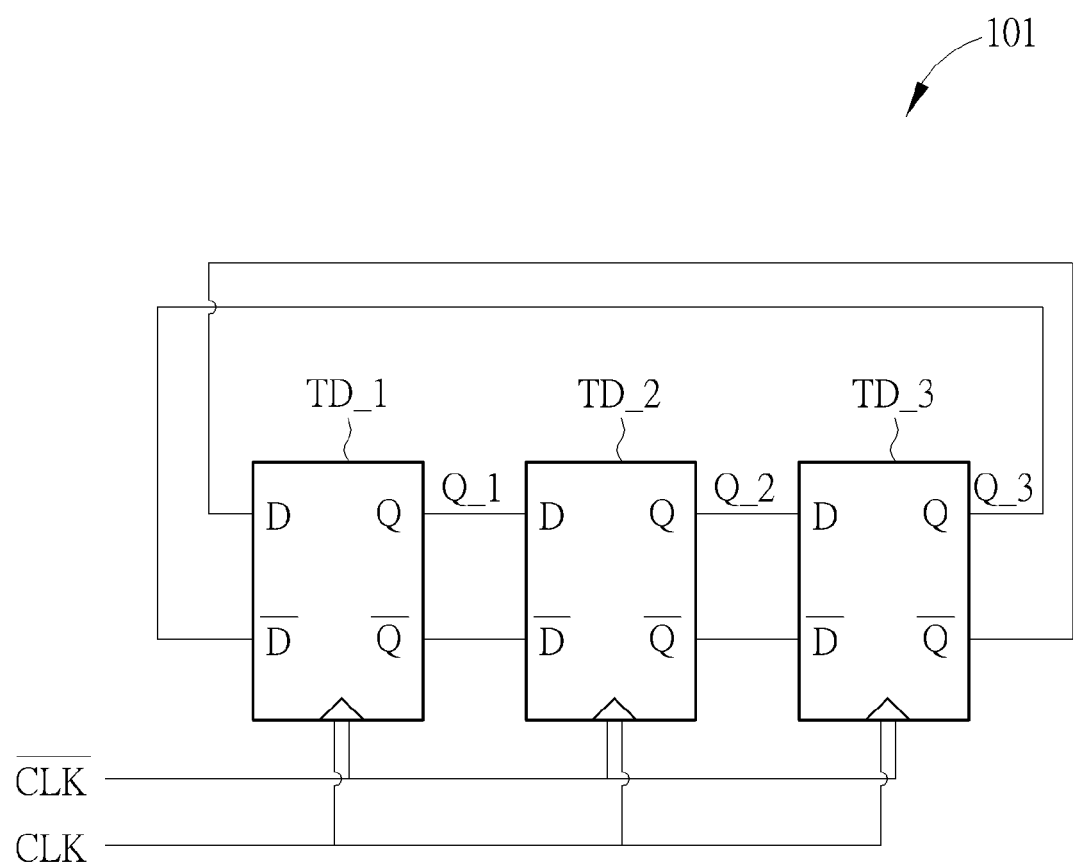
FIG. 3 is a circuit diagram illustrating the circuit for the frequency dividing module described in FIG. 1, according to one embodiment of the present application.

FIG. 3 is a circuit diagram illustrating the circuit for the frequency dividing module 101 described in FIG. 1, according to one embodiment of the present application. In the embodiment of FIG. 3, the frequency dividing module 101 comprises three level triggering devices TD_1, TD_2 and TD_3, which respectively outputs the frequency-divided signals Q_1, Q_2 and Q_3. The level triggering devices TD_1, TD_2 and TD_3 can be triggered by either the rising edge or the falling edge of the clock signal CLK based on the level of D and $\overline{D}$, to generate the frequency-divided signals Q_1, Q_2 and Q_3, thus the level triggering devices TD_1, TD_2 and TD_3 receive both the clock signal CLK and an inverted clock signal $\overline{CLK}$, which has inverted phase of the clock signal CLK. The operation for the level triggering devices TD_1, TD_2 and TD_3 can be illustrated as the following table T1. However, please note the level triggering devices TD_1, TD_2 and TD_3 illustrated in FIG. 3 are only example. Other devices can be applied to perform the function of the frequency dividing module. In one embodiment, the input signal INS in FIG. 1 or FIG. 2 is the clock signal CLK or the inverted clock signal $\overline{CLK}$.

| T1 | | |
|---|---|---|
| D | CLK | Q |
| 0 | 0 | 0 |
| 0 | 1 | Hold |
| 1 | 0 | Hold |
| 1 | 1 | 1 |

Figure 4:
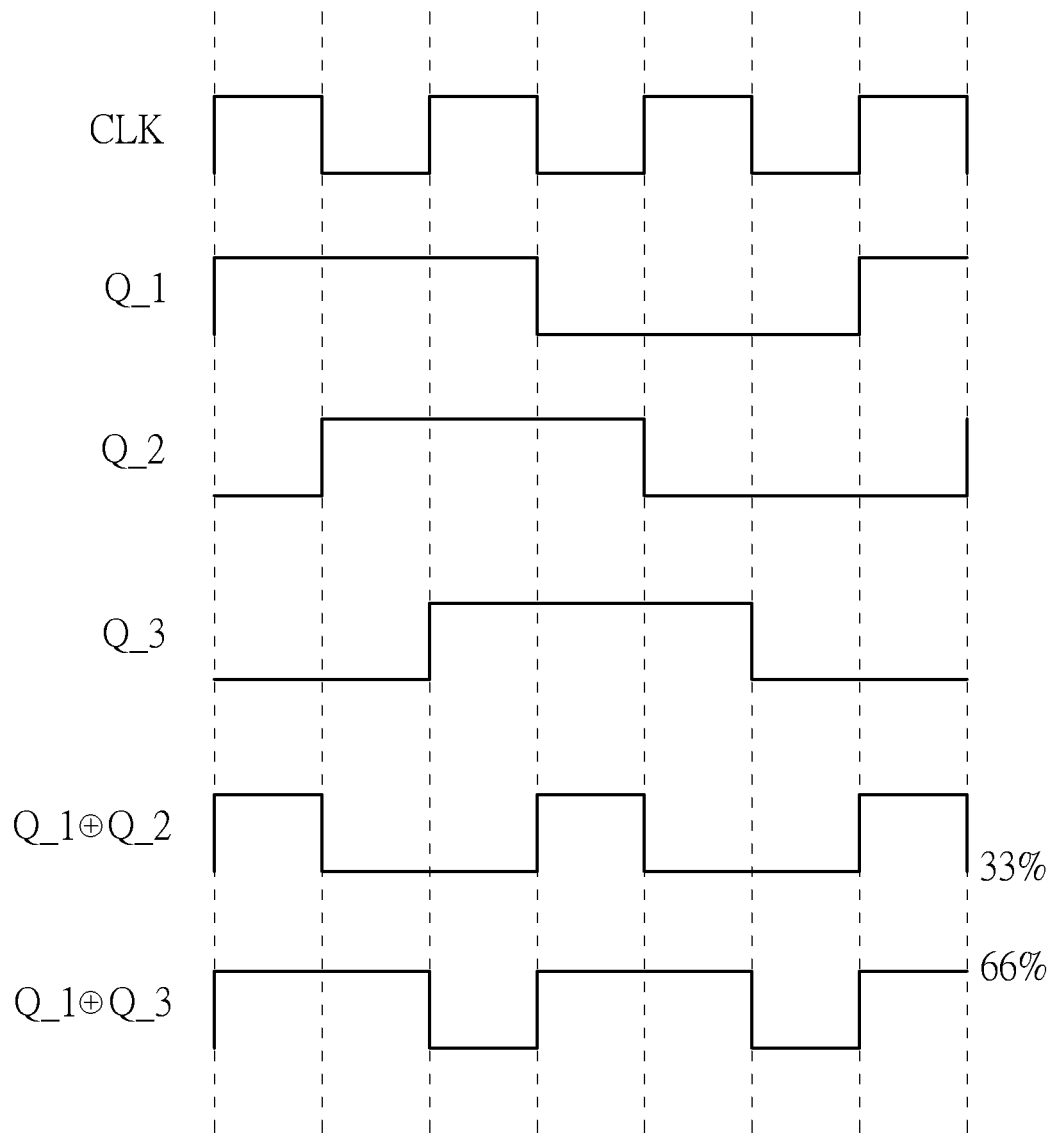
FIG. 4 is a wave chart illustrating the operation for the circuit shown in FIG. 3.

FIG. 4 is a wave chart illustrating the operation for the circuit shown in FIG. 3. In one embodiment, the signal combining module 103 in FIG. 1 comprises at least one XOR circuit. Therefore, if an XOR operation is performed to the frequency-divided signals Q_1, Q_2, an output combined signal Q_1⊕Q_2 is acquired (i.e. CS in FIG. 1). Also, if an XOR operation is performed to the frequency-divided signals Q_1, Q_3, an output combined signal Q_1⊕Q_3 (i.e. CS in FIG. 1) is acquired. In this case, the duty cycle for the output combined signal Q_1⊕Q_2 is 33%, and the duty cycle for the output combined signal Q_1⊕Q_3 is 66%. Accordingly, the output combined signals Q_1⊕Q_2 and Q_1⊕Q_3 are calibrated by the duty cycle calibrating circuit 105 to generate the output signal OS.

Figure 5:
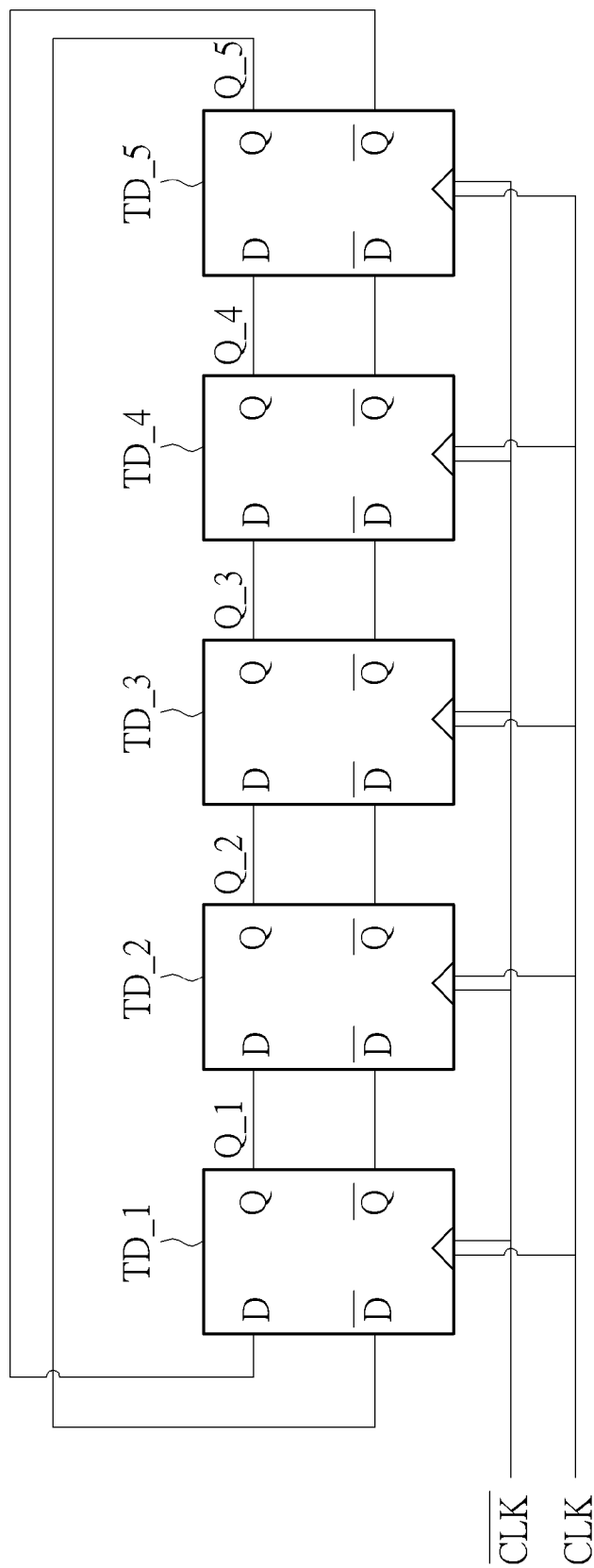
FIG. 5 is a circuit diagram illustrating the circuit for the frequency dividing module described in FIG. 1, according to another embodiment of the present application.

FIG. 5 is a circuit diagram illustrating the circuit for the frequency dividing module 101 described in FIG. 1, according to another embodiment of the present application. In this embodiment, the frequency dividing module 101 comprises five level triggering devices rather than three level triggering devices described in FIG. 3. For more detail, the frequency dividing module 101 comprises five level triggering devices TD_1-TD_5, which respectively outputs the frequency-divided signals Q_1-Q_5.

Figure 6:
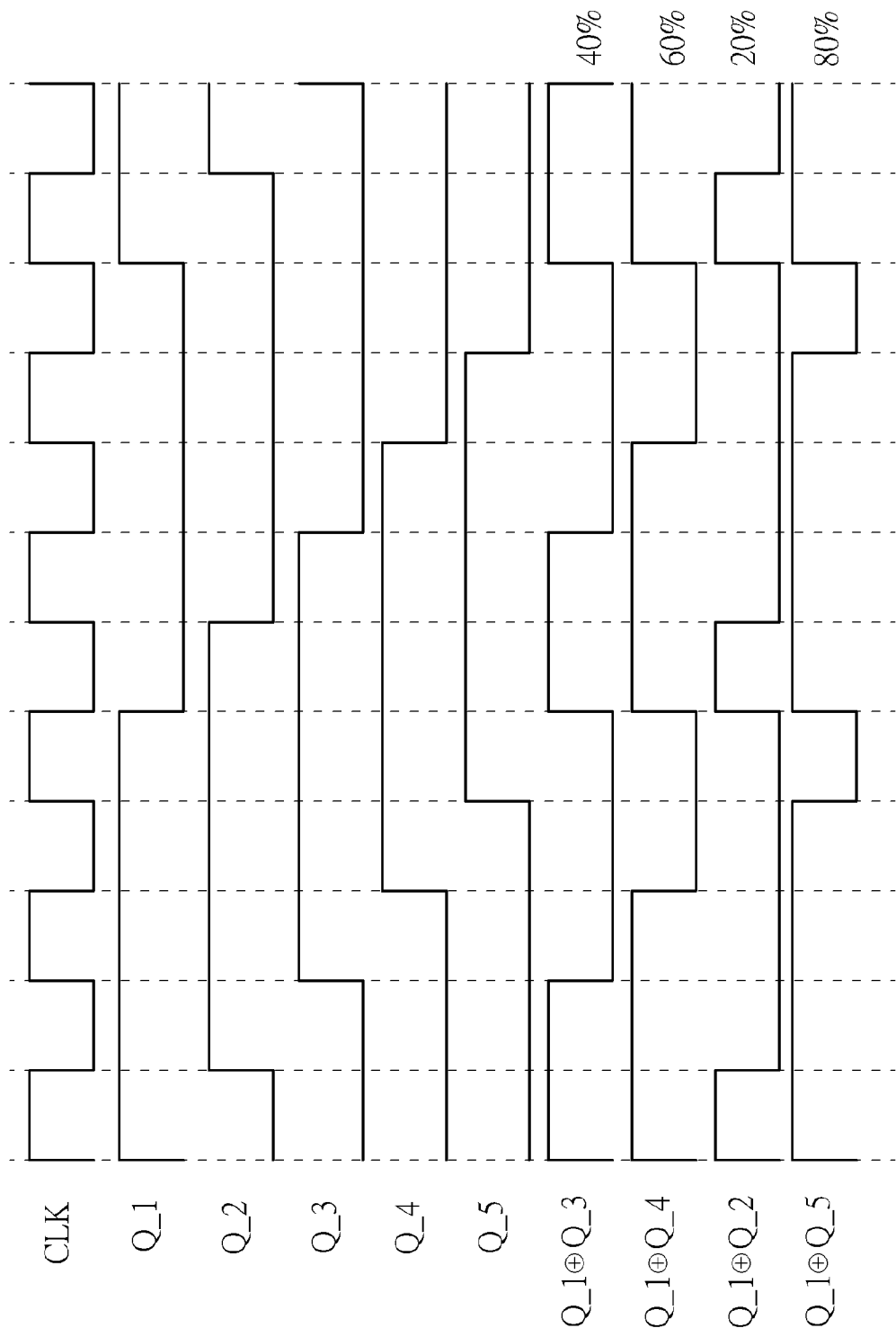
FIG. 6 is a wave chart illustrating the operation for the circuit shown in FIG. 5.

FIG. 6 is a wave chart illustrating the operation for the circuit shown in FIG. 5. As above-mentioned, in one embodiment, the signal combining module 103 in FIG. 1 comprises at least one XOR circuit. Therefore, the output combined signals Q_1⊕Q_3, Q_1⊕Q_4, Q_1⊕Q_2, and Q_1⊕Q_5 can be acquired. Please note, any two of the frequency divided signals can be selected to generate the output signal.

Figure 7:
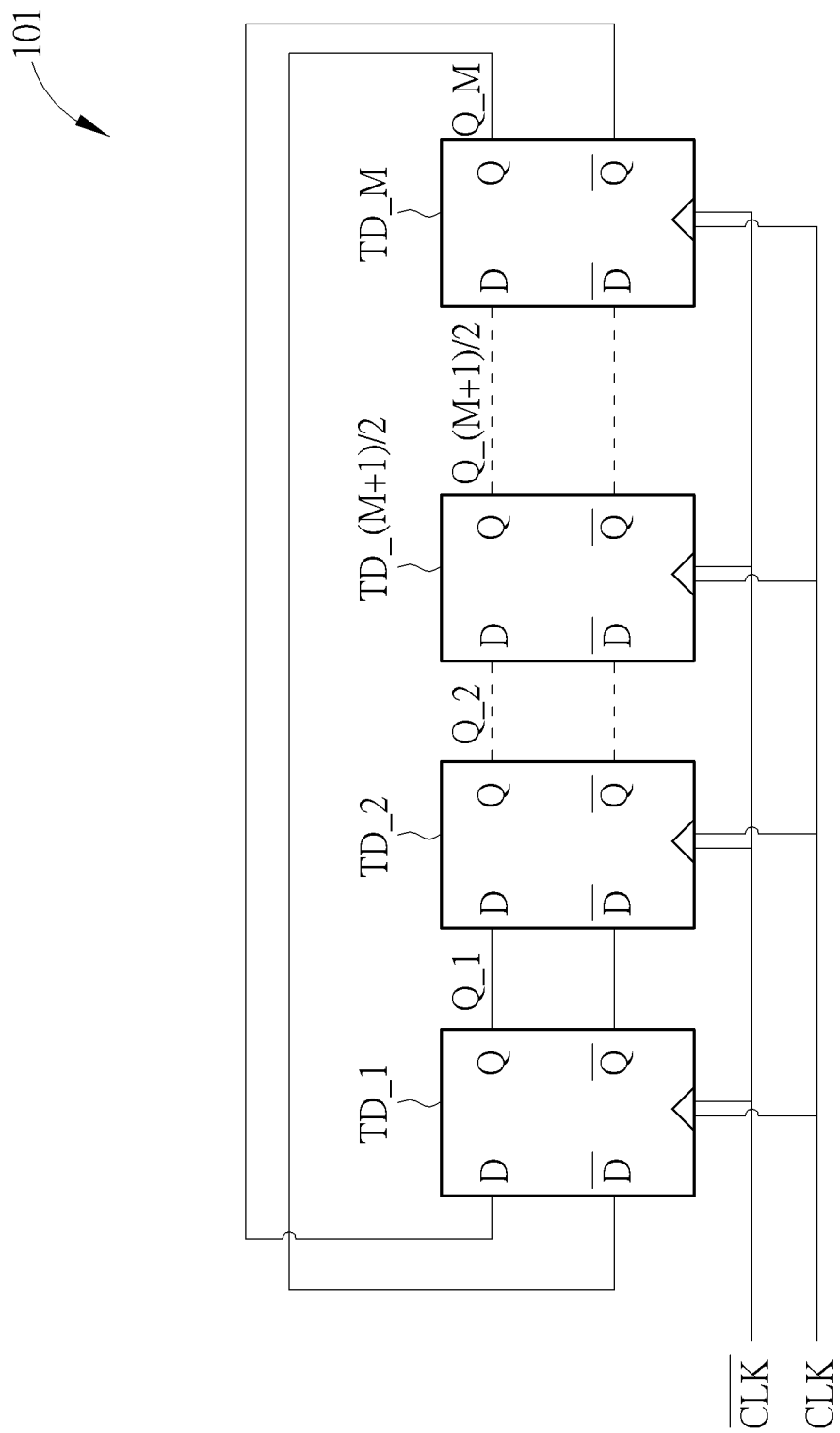
FIG. 7 is a circuit diagram illustrating the circuit for the frequency dividing module described in FIG. 1, according to still another embodiment of the present application.

In view of the embodiments of FIG. 3 and FIG. 5, the frequency dividing module 101 can comprise any odd number of level triggering devices. FIG. 7 is a circuit diagram illustrating the circuit for the frequency dividing module 101 described in FIG. 1, according to still another embodiment of the present application. As shown in FIG. 7, the frequency dividing module 101, which has a frequency dividing ratio of M, comprises M level triggering devices Q_1-Q_M, wherein M equals to 2*(N.5). Therefore, the frequency dividing module 101 in FIG. 7 can generate M frequency divided signals Q_1-Q_M.

Figure 8A:
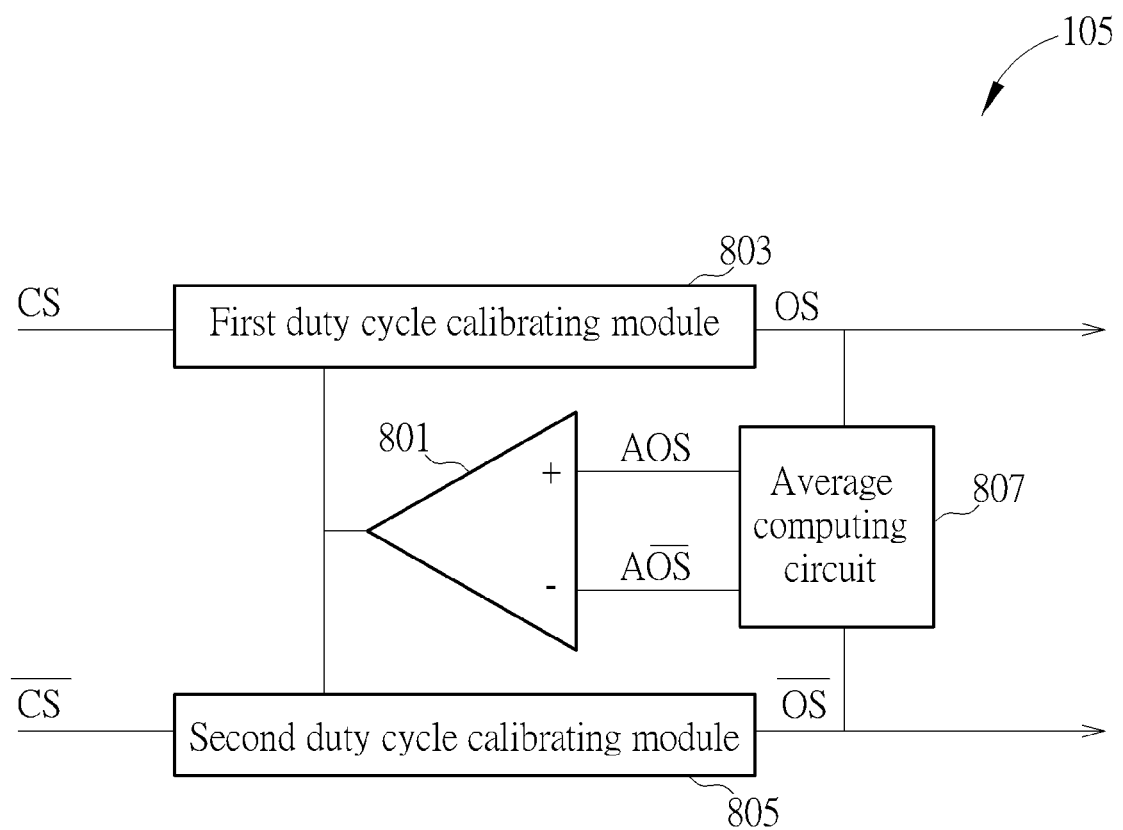
FIG. 8A is a circuit diagram illustrating the duty cycle calibrating circuit in FIG. 2, according to one embodiment of the present application.

FIG. 8A is a circuit diagram illustrating the duty cycle calibrating circuit 105 in FIG. 1, according to one embodiment of the present application. As shown in FIG. 8A, the duty cycle calibrating circuit 105 comprises a comparator 801, a first duty cycle calibrating module 803 and a second duty cycle calibrating module 805. The comparator 801 compares a duty cycle for the output signal OS and a duty cycle for an inverted output signal $\overline{OS}$, to generate a comparing result. In one embodiment, the comparator 801 compares an average voltage signal AOS and an average voltage signal $\overline{AOS}$ to generate the comparing result, but not limited. The average voltage signal AOS indicates the average voltage of the output signal OS, which is the DC voltage level of the output signal OS, and the average voltage signal $\overline{AOS}$ indicates the average voltage of the inverted output signal $\overline{OS}$, which is the DC voltage level of the inverted output signal $\overline{OS}$. The DC voltage level can be acquired via filtering the output signal OS and the inverted output signal $\overline{OS}$. The average voltage signal AOS and the average voltage signal $\overline{AOS}$ can be acquired by an average computing circuit 807 as shown in FIG. 8A, but not limited. The first duty cycle calibrating module 803 calibrates an edge of the output signal OS according to the comparing result. The second duty cycle calibrating module 805 calibrates an edge for the inverted output signal OS according to the comparing result. Please note in this embodiment the duty cycle calibrating circuit 105 comprises two duty cycle calibrating modules since the duty cycle calibrating circuit 105 is designed to generate a differential signal as the output signal.

As above-mentioned the delay module 205 can further comprise a function of calibrating the duty cycle. In such case, the delay module 205 comprises a circuit for delaying and a circuit for calibrating the duty cycle. The circuit for calibrating the duty cycle can be, for example, the structure in FIG. 8A, but also can be a circuit with other structures. The circuit for delaying can comprise various kinds of structures and is well known by persons skilled in the art, thus the description thereof is omitted for brevity here.

In one embodiment the duty cycle calibrating circuit 105 can comprise only one of the duty cycle calibrating modules to generate a single-ended signal as the output signal. In such case, one input terminal of the comparator 801 is coupled to a constant voltage level.

Please note, the duty cycle calibrating circuit 105 is not limited to the structure depicted in FIG. 8A. For example, the comparator 801 can compare the average voltage for one of the output signal OS and the inverted output signal $\overline{OS}$ with a predetermined voltage level to determine if the output signal OS has a 50% duty cycle. In such case, the output signal is a single-ended signal.

Figure 8B:
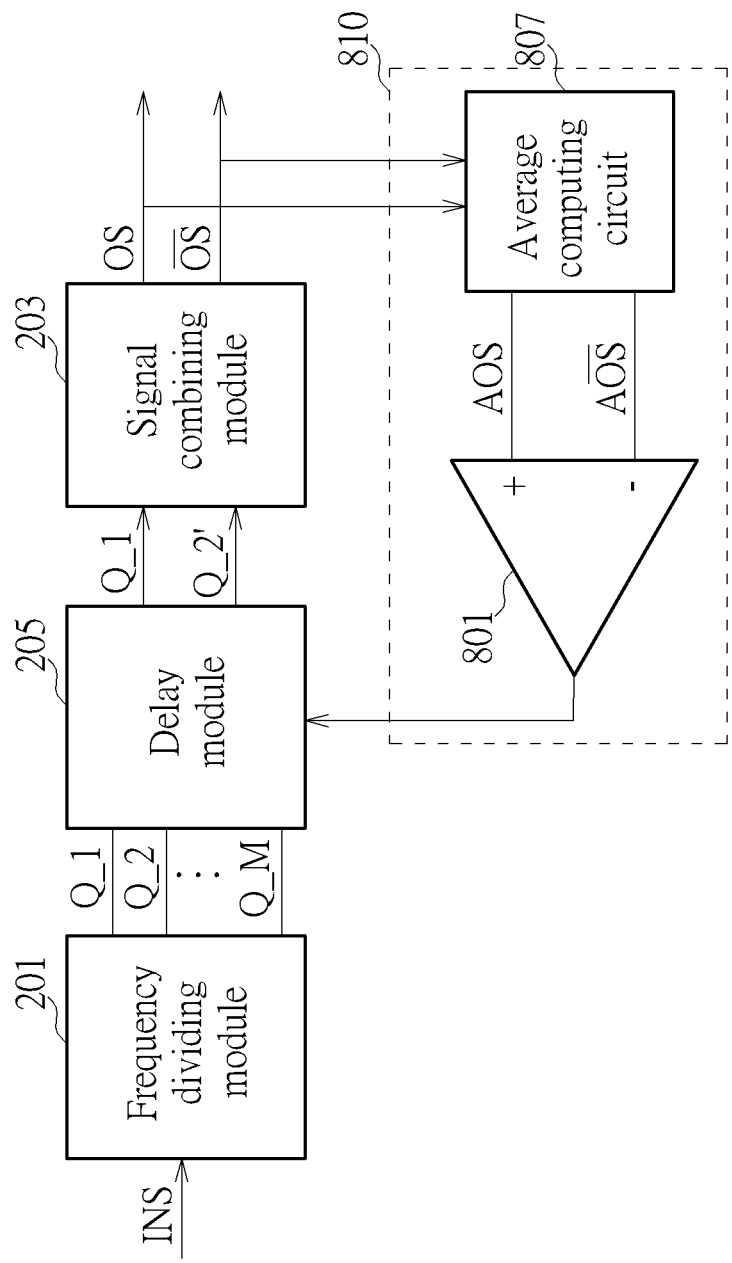
FIG. 8B is a block diagram illustrating that the signal generating system comprises a calibrating circuit, which comprises the comparator and the average computing circuit depicted in FIG. 8A.

Please refer to FIG. 8B, which illustrates a structure that the signal generating system 200 in FIG. 2A comprises a calibrating circuit 810, which comprises the comparator 801 and the average computing circuit 807 depicted in FIG. 8A. The calibrating circuit 810 detects if the output signal OS and the inverted output signal $\overline{OS}$ both have a 50% duty cycle. If not, the calibrating circuit 810 adjusts the delay amount of the delay module 205. If yes, the calibrating circuit 810 does not adjust the delay amount of the delay module 205. The operations for the comparator 801 and the average computing circuit 807 depicted in FIG. 8B can be understood according to the description for the comparator 801 and the average computing circuit 807 in FIG. 8A, thus are omitted for brevity here.

FIG. 9A, FIG. 9B, FIG. 10A, FIG. 10B and FIG. 10C are examples of the first duty cycle calibrating module and the second duty cycle calibrating module in FIG. 8A. Please note these examples are only for explaining the operation of the first duty cycle calibrating module and the second duty cycle calibrating module in FIG. 8A. Any circuit that can perform the function of the first duty cycle calibrating module and the second duty cycle calibrating module in FIG. 8A should fall in the scope of the present application. For example, the amount and the arrangement for buffers or inverters can be verified corresponding to different requirements.

Figure 9A:
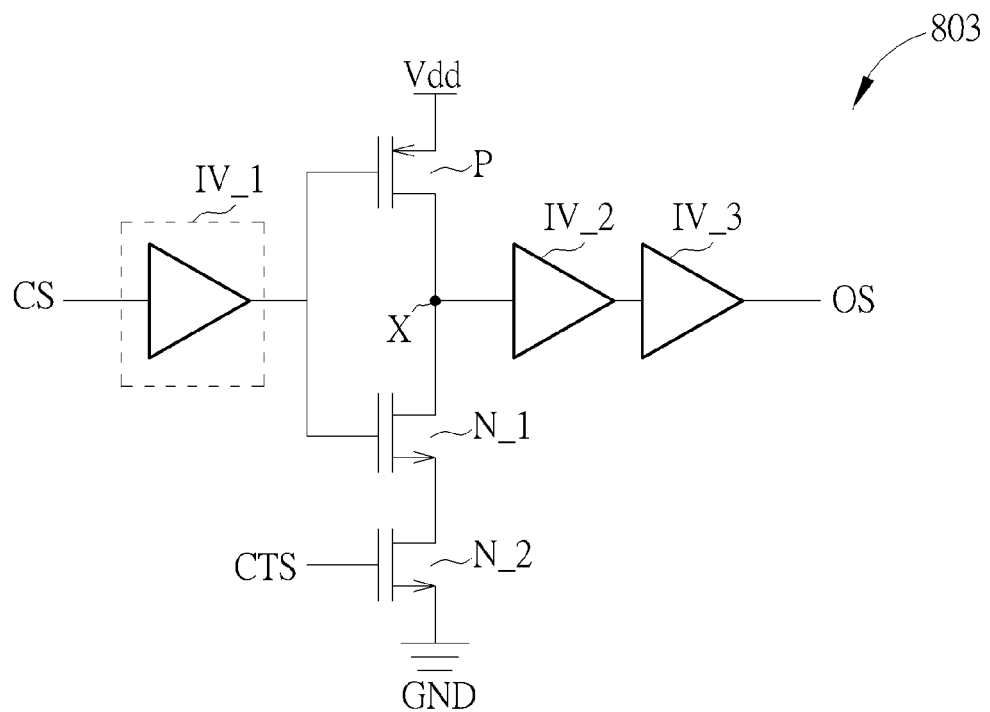
FIG. 9A, 9B are circuit diagram illustrating the first duty cycle calibrating module and the second duty cycle calibrating module in FIG. 8A, according to one embodiment of the present application.
Figure 9B:
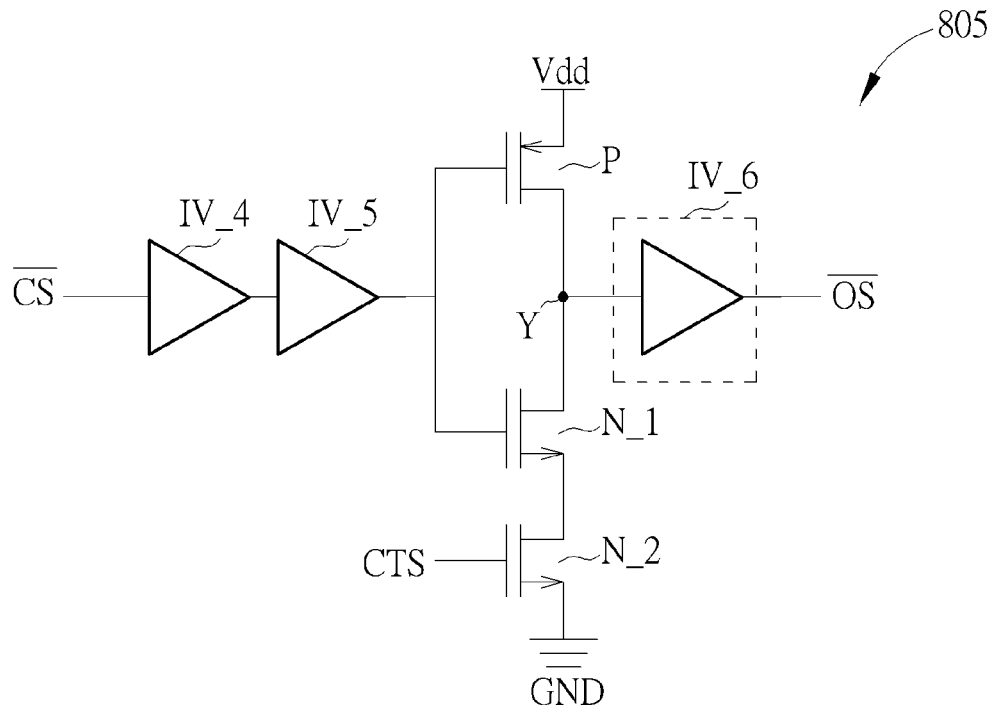

FIG. 9A and FIG. 9B are circuit diagrams illustrating the first duty cycle calibrating module and the second duty cycle calibrating module in FIG. 8A, according to one embodiment of the present application. As shown in FIG. 9A and FIG. 9B, the first duty cycle calibrating module 803 comprises: a transistor of second type P, a first transistor of first type N_1, a second transistor of first type N_2, a first inverter IV_1, a second inverter IV_2 and a third inverter IV_3. The second duty cycle calibrating module 805 comprises: a transistor of second type P, a first transistor of first type N_1, a second transistor of first type N_2, a fourth inverter IV_4, a fifth inverter IV_5 and a sixth inverter IV_6. The transistor of second type P, comprises a first terminal coupled to a first voltage level Vdd, a second terminal and a control terminal. The first transistor of first type N_1 comprises a first terminal coupled to the second terminal of the transistor of second type P, a second terminal and a control terminal. The second transistor of first type N_2 comprises a first terminal coupled to the second terminal of the first transistor of first type N_1, a second terminal coupled to a second voltage level GND and a control terminal. Please note, in one example, the transistor of first type described in the present application is an NMOSFET, and the transistor of second type in the present application is a PMOSFET, but not limited. Please note the second transistor of first type N_2 in FIG. 9A and FIG. 9B can be replaced with a tunable resistor.

In FIG. 9A, the output terminal of the first inverter IV_1 is coupled to the control terminals of the transistor of second type P and the first transistor of first type N_1. The input terminal of the second inverter IV_2 is coupled to the second terminal of the transistor of second type P. The input terminal of the third inverter IV_3 is coupled to an output terminal of the second inverter IV_2.

In FIG. 9B, the output terminal of the fourth inverter IV_4 is coupled to an input terminal of the fifth inverter IV_5. The output terminal of the fifth inverter IV_5 is coupled to the control terminals of the transistor of second type P and the first transistor of first type N_1. The input terminal of the sixth inverter IV_6 is coupled to the second terminal of the transistor of second type P.

Figure 10A:
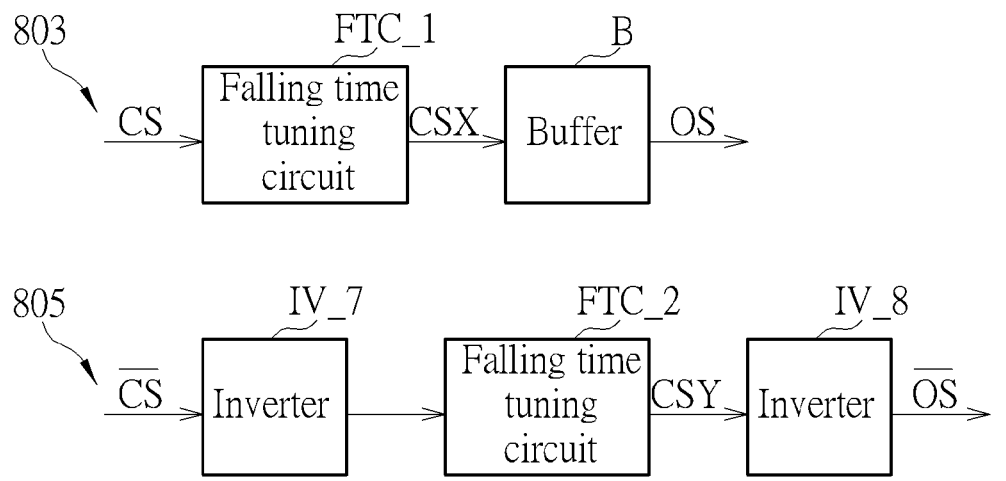
FIG. 10A, FIG. 10B, FIG. 10C, FIG. 10D are block diagrams illustrating the duty cycle calibrating circuits according to one embodiment of the present application.
Figure 10A:
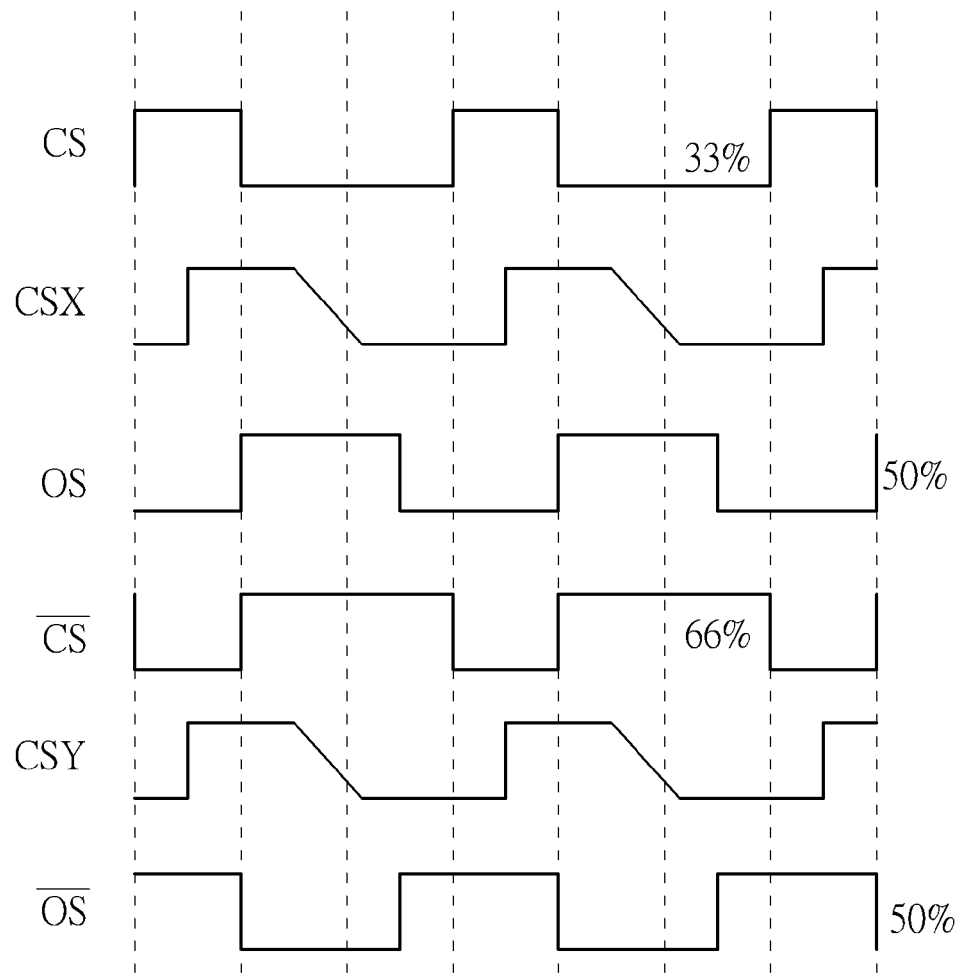

The transistor of second type P, the first transistor of first type N_1, the second transistor of first type N_2, and the first inverter IV_1 in FIG. 9A can be regarded as a first falling time tuning circuit FTC_1 in FIG. 10A. The second inverter IV_2 and the third inverter IV_3 in FIG. 9A can be regarded as a buffer B in FIG. 10A.

Additionally, the transistor of second type P, the first transistor of first type N_1, the second transistor of first type N_2, and the fifth inverter IV_5 in FIG. 9B can be regarded as a second falling time tuning circuit FTC_2 in FIG. 10A. The fourth inverter IV_4 and the sixth inverter IV_6 are respectively the seventh inverter IV_7 and the eighth inverter IV_8 in FIG. 10A.

Accordingly, the circuits in FIG. 9A and FIG. 9B can be summarized as the block diagram depicted in FIG. 10A. The signal waveform of the circuit 803, 805, is illustrated in FIG. 10A. As illustrated in FIG. 10A, the first falling time tuning circuit FTC_1 adjusts the falling time of the output combined signal CS to generate a first adjusted output combined signal CSX. The buffer B buffers the adjusted output combined signal CSX to generate the output combined signal OS. The inverted output combined signal CS is inverted by the seventh inverter IV_7 and then adjusted by the second falling time tuning circuit FTC_2 to generate the second adjusted output combined signal CSY. After that, the second adjusted output combined signal CSY is inverted by the eighth inverter IV_8 again to generate the inverted output signal $\overline{OS}$.

FIG. 10A also illustrates a wave chart illustrating the operation for the circuit described in FIG. 10A. As shown in FIG. 10A, the output combined signal CS has a 33% duty cycle, such that the inverted output combined signal $\overline{CS}$ has a 66% duty cycle. After processed by the falling time tuning circuit FTC_1 and the buffer B, the falling edge of the output combined signal CS can be delayed, such as the first adjusted output combined signal CSX. The delay level for the falling edge of the output combined signal CS can be adjusted via controlling the resistance of the falling time tuning circuit FTC_1. Similarly, after processed by the falling time tuning circuit FTC_2, the rising edge of the output combined signal $\overline{CS}$ can be delayed such as the second adjusted output combined signal CSY. The delaying level for the falling edge of the output combined signal CS can be adjusted via controlling the resistance of falling time tuning circuit FTC_2.

Figure 10B:
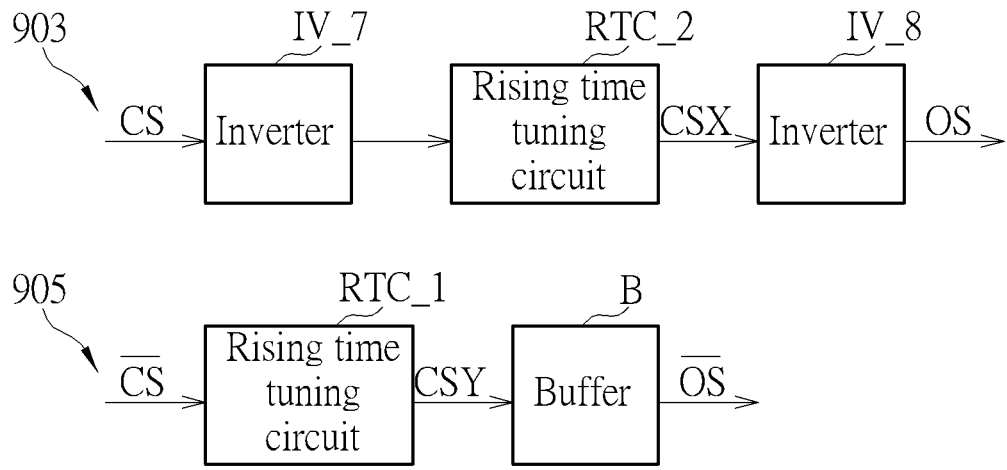
Figure 10B:
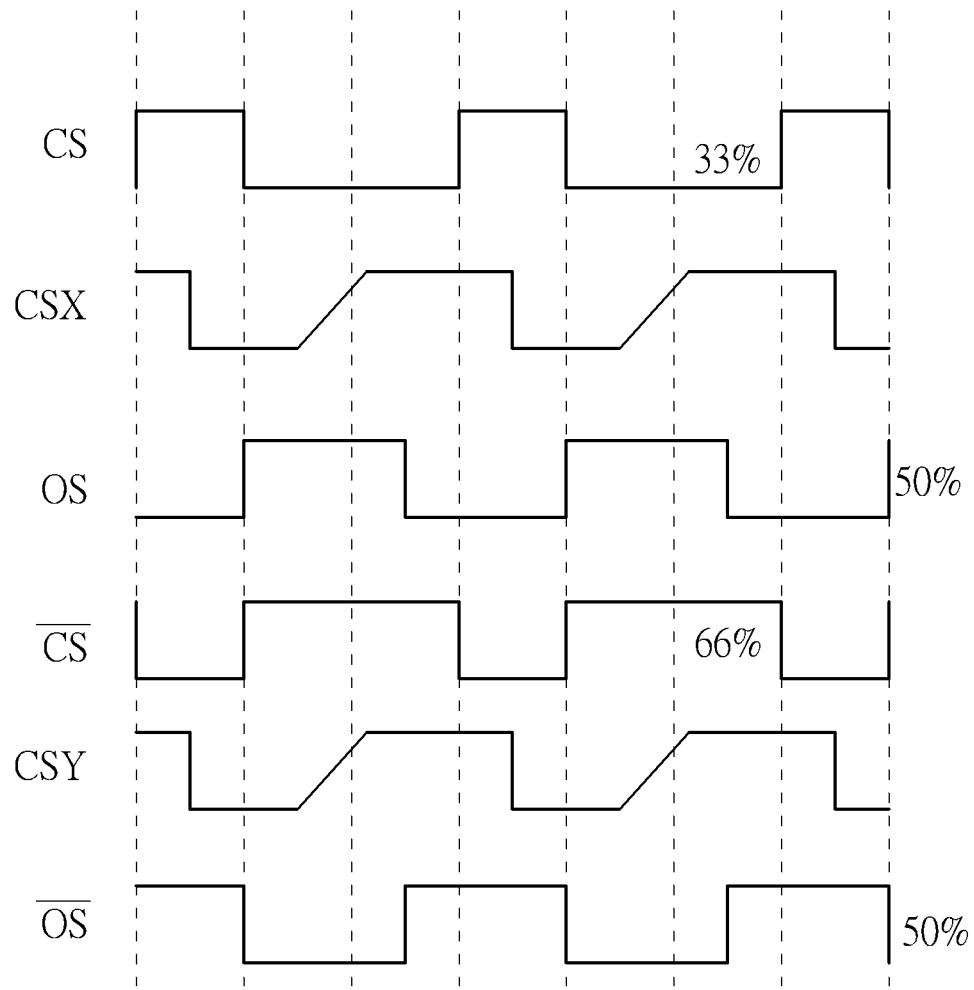

Please note the structure of the duty cycle calibrating circuit according to the embodiment of the present application is not limited to the circuits depicted in FIG. 9A, FIG. 9B and FIG. 10A. As illustrated in FIG. 10B, the duty cycle calibrating circuit 903 corresponds the structures of the second duty cycle calibrating module 803 in FIG. 10A to process the output combined signal CS. Also, the duty cycle calibrating circuit 905 corresponds to the structures of the duty cycle calibrating module 805 in FIG. 10A to process the inverted output combined signal $\overline{CS}$. Please note the duty cycle calibrating circuits 903, 905 apply the first rising time tuning circuit RTC_1 and the second rising time tuning circuit RTC_2 to respectively adjust the inverted output combined signal $\overline{CS}$ and the inverted signal of the output combined signal CS rather than the first falling time tuning circuit FTC_1 and the second falling time tuning circuit FTC_2 stated in FIG. 10A.

Figure 10C:
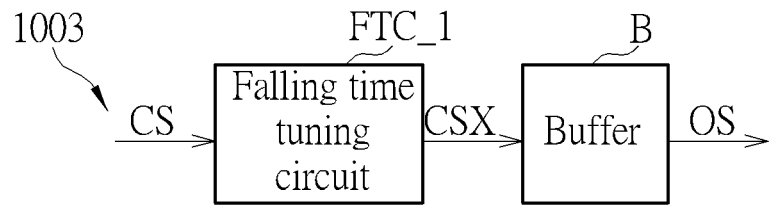
Figure 10C:
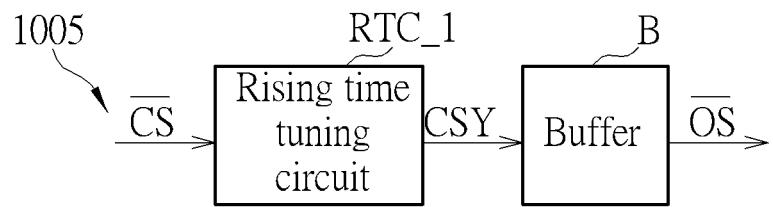
Figure 10C:
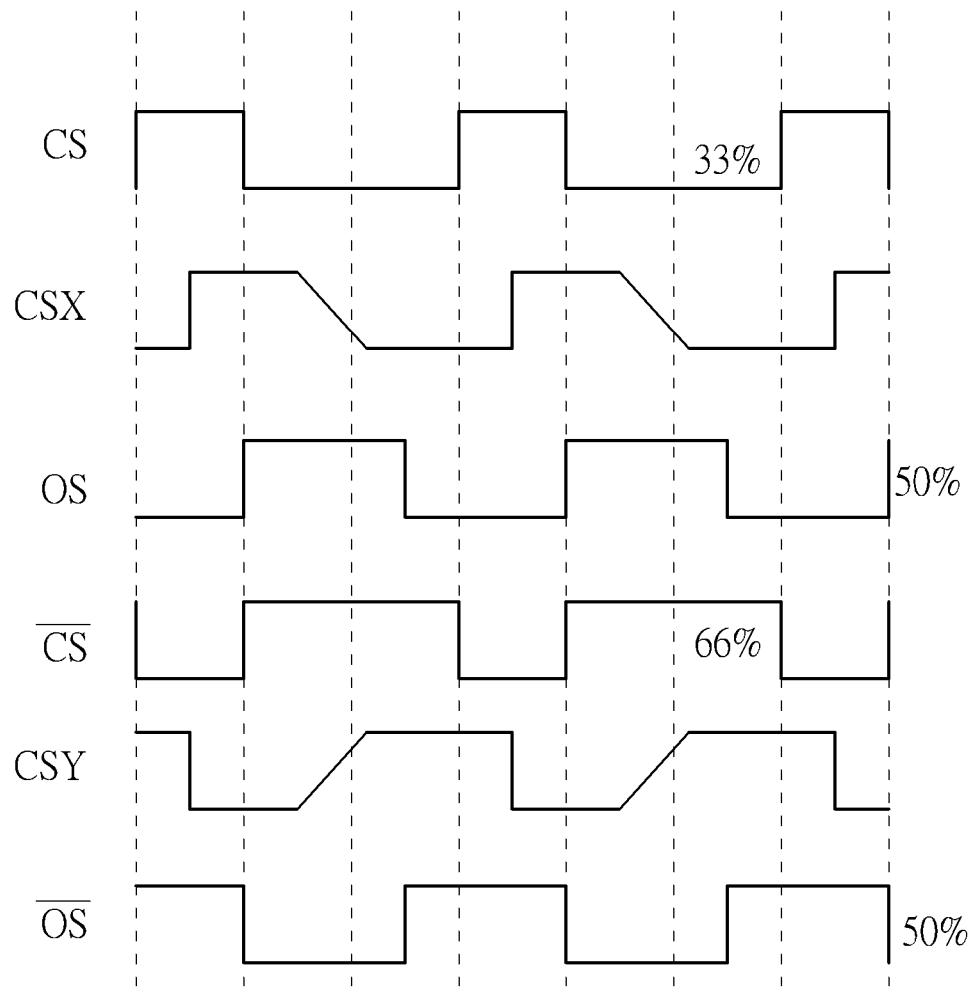

In the embodiment of FIG. 10C, the duty cycle calibrating circuit 1003 applies the structure of the duty cycle calibrating module 803 in FIG. 10A, and the duty cycle calibrating circuit 1005 applies the structure of the duty cycle calibrating module 905 in FIG. 10B. The operations for the duty cycle calibrating circuits 1003 and 1005 can be acquired based on the description for the duty cycle calibrating module 803 and 905, thus are omitted for brevity here.

Figure 10D:
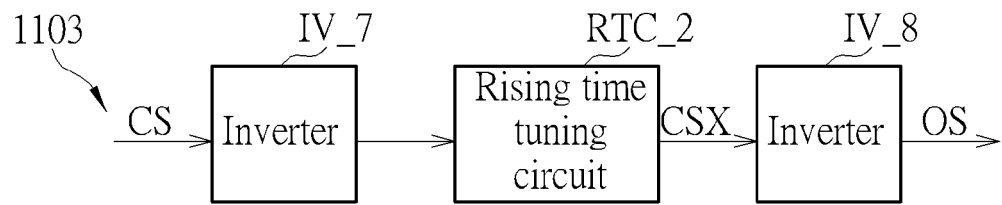
Figure 10D:
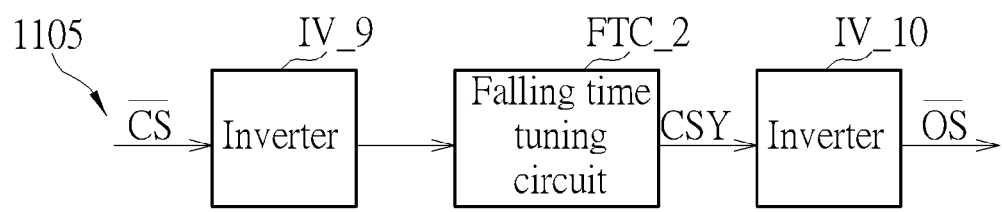
Figure 10D:
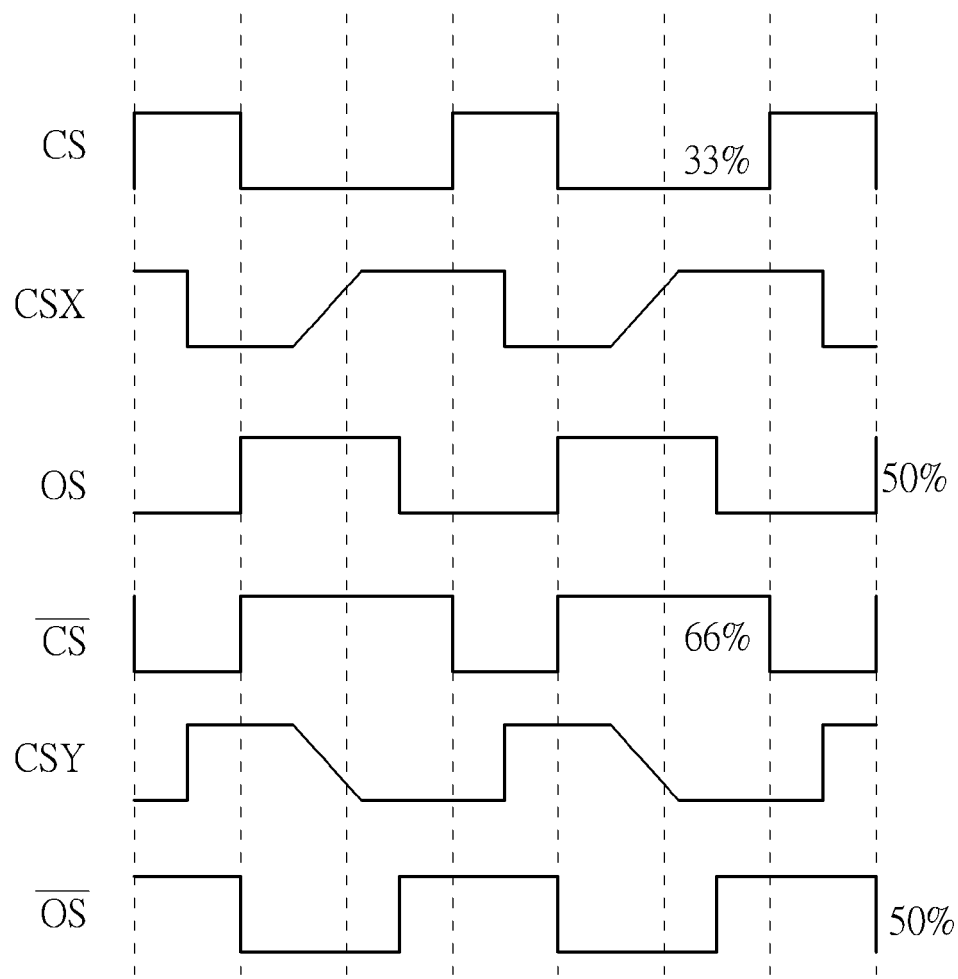

In the embodiment of FIG. 10D, the duty cycle calibrating circuits 1103 and 1105 respectively applies the structure of the duty cycle calibrating module 903 in FIG. 10B and the duty cycle calibrating module 805 in FIG. 10A. That is, the duty cycle calibrating circuits 1103 comprises a seventh inverter IV_7, an eighth inverter IV_8 and a second rising time tuning circuit RTC_2. Also, the duty cycle calibrating circuits 1105 comprises a ninth inverter IV_9, a tenth inverter IV_10 and a second falling time tuning circuit FTC_2. The operations for the duty cycle calibrating circuits 1103 and 1105 can be acquired based on the description for the duty cycle calibrating module 903, 805, thus are omitted for brevity here.

Please note the duty cycle calibrating circuits depicted in the embodiments of FIG. 10A-FIG. 10D are not limited to be applied the signal combining module of the present application. Accordingly, the duty cycle calibrating circuit comprising the structure of the duty cycle calibrating module 803 can be summarized as: a first falling time tuning circuit (ex. FTC_1), for receiving an input signal to generate a first adjusted input signal; a buffer (ex. B), for buffering the first adjusted input signal to generate a calibrated signal.

Also, the duty cycle calibrating circuit comprising the structure of the duty cycle calibrating module 805 can be summarized as: a seventh inverter (ex. IV_7), for receiving an input signal; a second falling time tuning circuit (ex. FTC_2), for receiving output from the sixth inverter to generate a second adjusted input signal (ex. CSY); and an eighth inverter (ex. IV_8), for inverting the second adjusted input signal to generate a calibrated signal.

Figure 11:
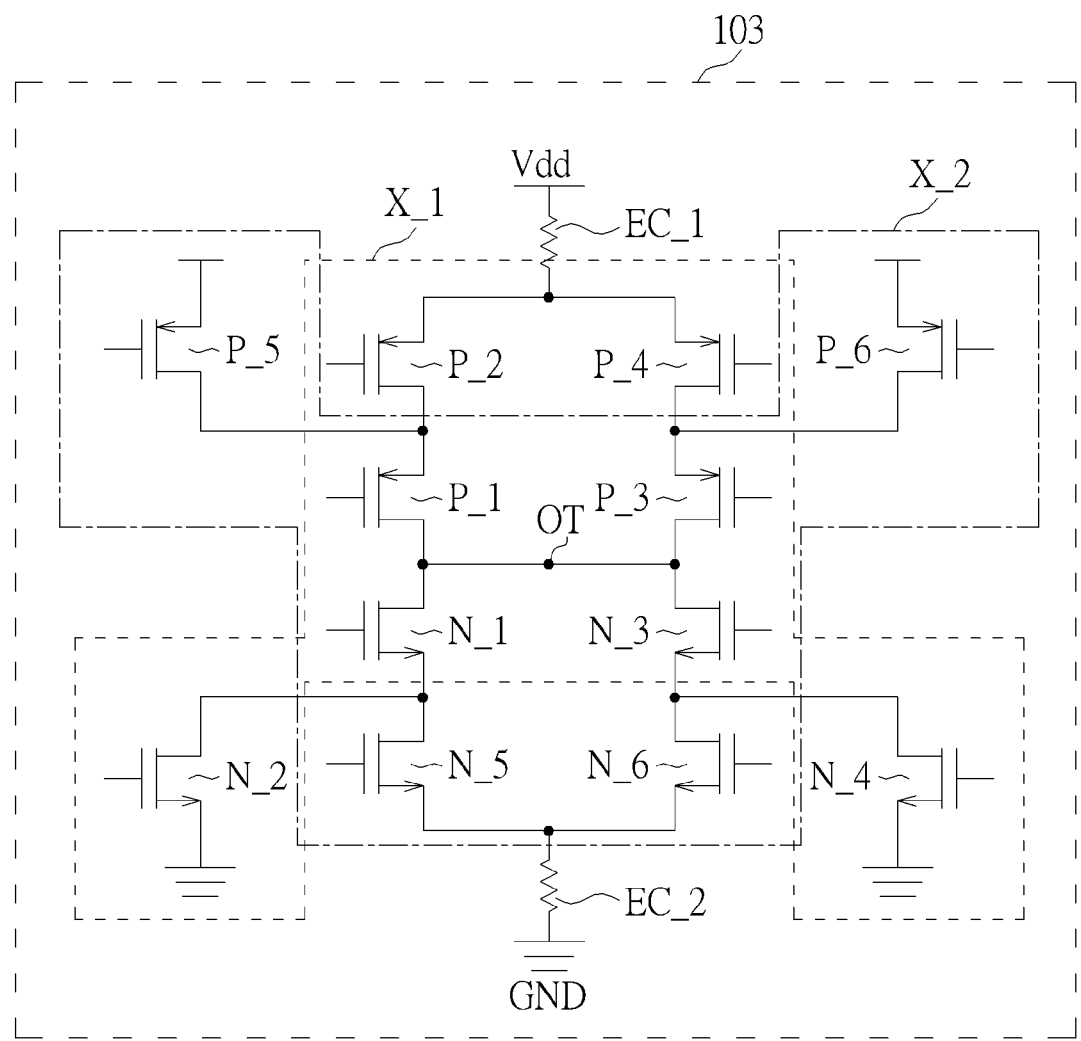
FIG. 11 is a circuit diagram illustrating a circuit for the signal combining module described in FIG. 1, according to one embodiment of the present application.

FIG. 11 is a circuit diagram illustrating a circuit for the signal combining module 103 described in FIG. 1, according to one embodiment of the present application. As shown in FIG. 11, the signal combining module 103 comprises: a first initial combining circuit X_1 (in one embodiment, a XOR circuit), a second initial combining circuit X_2 (in one embodiment, a XOR circuit), a first edge calibrating device EC_1 and a second edge calibrating device EC_2. The first initial combining circuit X_1 and the second initial combining circuit X_2 receive a plurality of the frequency divided signals to generate output combined signals (i.e. CS in FIG. 1). The first edge calibrating device EC_1 is coupled between a first voltage level Vdd and the first initial combining circuit X_1, to integrate an edge of the output combined signals. The second edge calibrating device EC_2 is coupled between a second voltage level GND and the second initial combining circuit X_2, to integrate an edge of the output combined signals. In this embodiment, the first edge calibrating device EC_1 and the second edge calibrating device EC_2 are resistors. However, the first edge calibrating device EC_1 and the second edge calibrating device EC_2 can be replaced by other devices or circuits such as a MOSFET or a current source.

In one embodiment, the first initial combining circuit X_1 comprises the first transistor of first type N_1, the second transistor of first type N_2, the third transistor of first type N_3, the fourth transistor of first type N_4, the first transistor of second type P_1, the second transistor of second type P_2, the third transistor of second type P_3, and the fourth transistor of second type P_4. Also, the second initial combining circuit X_2 comprises the first transistor of first type N_1, the third transistor of first type N_3, the fifth transistor of first type N_5, the sixth transistor of first type N_6, the first transistor of second type P_1, the third transistor of second type P_3, the fifth transistor of second type P_5, and the sixth transistor of second type P_6. The detail connections for the transistors are illustrated in FIG. 11, thus are omitted for brevity here.

Figure 12:
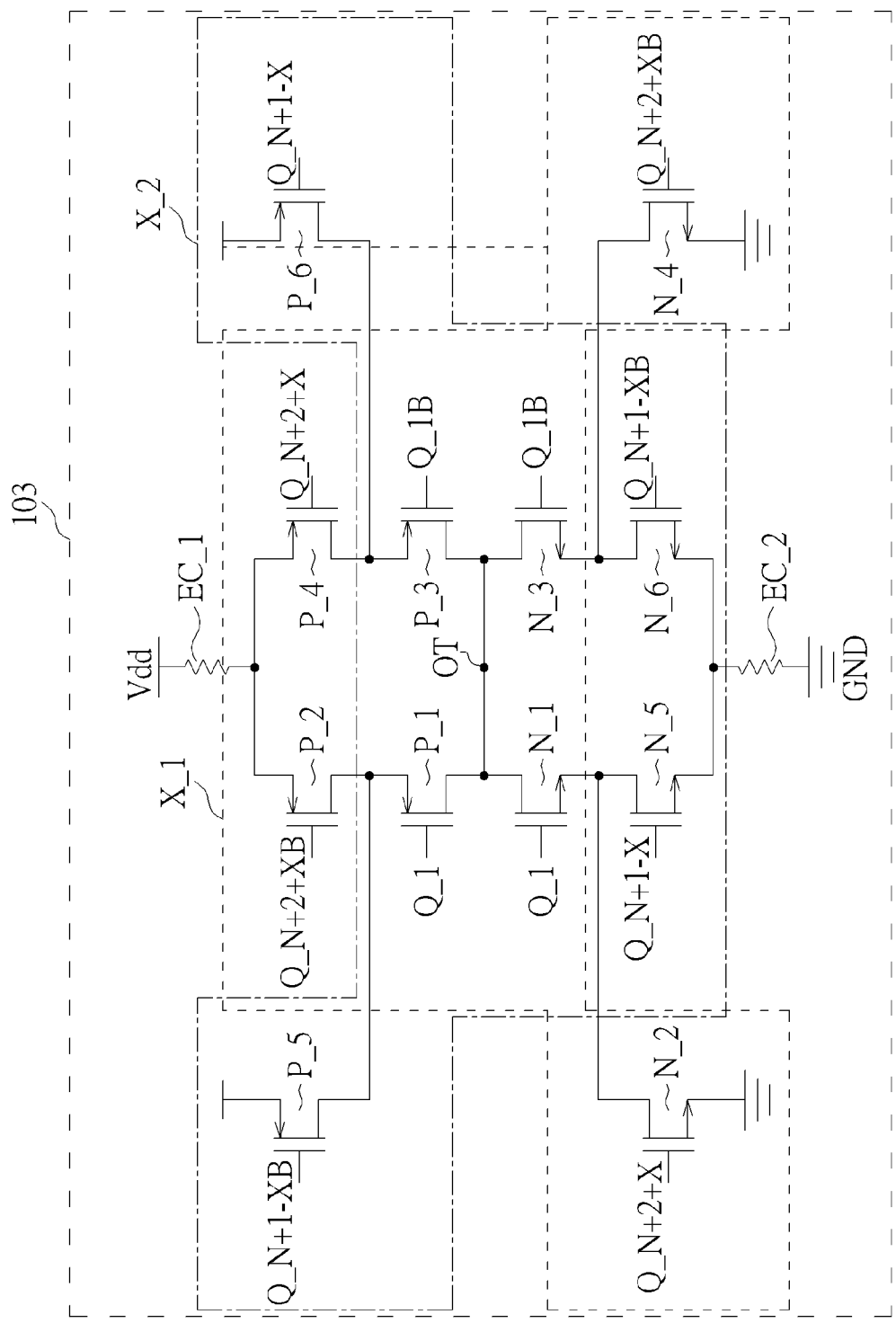
FIG. 12 and FIG. 13 are examples for the operation of the circuit described in FIG. 11.
Figure 13:
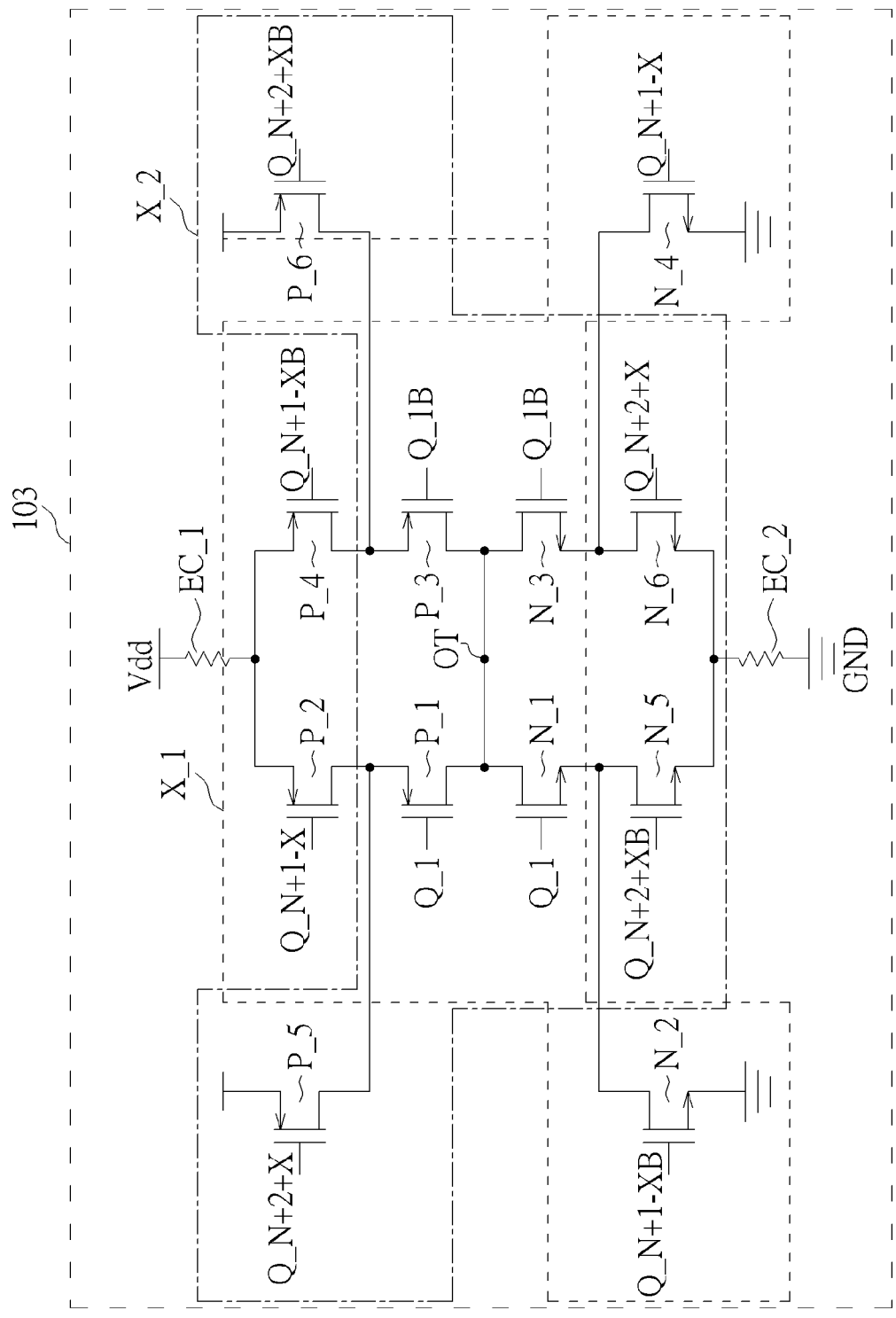

FIG. 12 and FIG. 13 are examples for the operation of the circuit described in FIG. 11. Please note the N illustrated in FIG. 12 and FIG. 13 is the same as the N for the frequency dividing ratio N.5 depicted in FIG. 1. For example, if the frequency dividing module 101 cooperates with the signal combining module 103 to have a frequency ratio of 2.5, the N is 2. Additionally, the X illustrated in FIG. 12 and FIG. 13 is a positive integer between 0~N−1. Furthermore, the symbol "B" indicates an inverted signal. For example, Q_1B is an inverted signal of Q_1, and Q_N+2+XB is an inverted signal of Q_N+2+X. Via setting N and X, the frequency divided signals inputted to the signal combining module 103 can be set to any combination. Please note the combinations illustrated in FIG. 12 and FIG. 13 are only two examples and do not mean to limit the scope of the present application. The output combined signal generated by the embodiment in FIG. 12 is an inverted signal for the output combined signal generated by the embodiment in FIG. 13.

Figure 14:
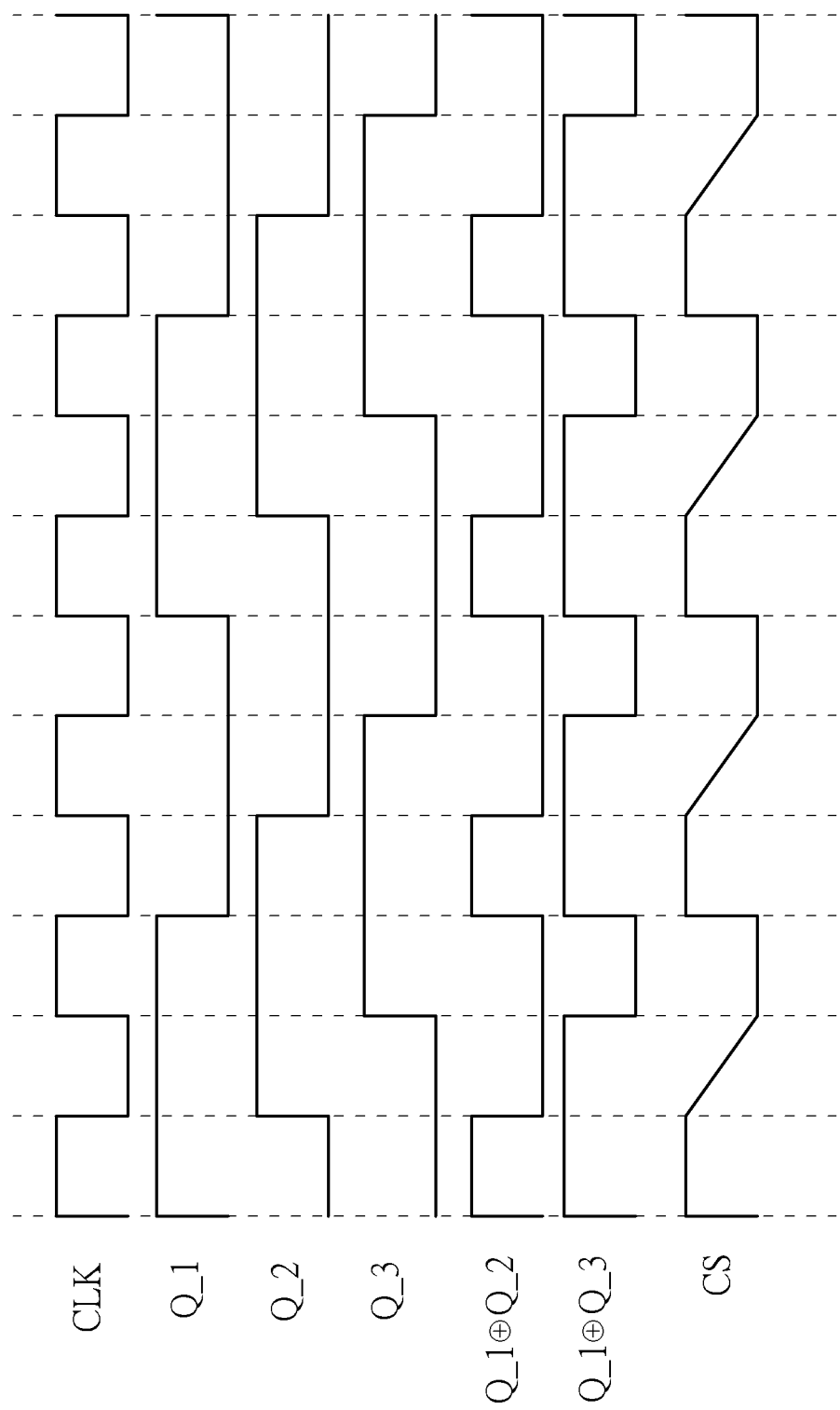
FIG. 14 is a wave chart illustrating the operation for the embodiments of FIG. 12.

FIG. 14 is a wave chart illustrating the operation for the embodiment of FIG. 12. As shown in FIG. 14, frequency divided signals Q1_Q3 are input to the transistors in FIG. 11 (i.e. N=1 and x=0), such that output combined signals Q_1⊕Q_3 and Q_1⊕Q_2 are generated. Also, the falling edges of the output combined signals Q_1⊕Q_3 and Q_1⊕Q_2 are integrated to generate the output combined signal CS, which has a 50% duty cycle. The output signal in FIG. 13 is an inverted signal for the output signal in FIG. 12, thus the wave chart is omitted for brevity here.

Figure 15:
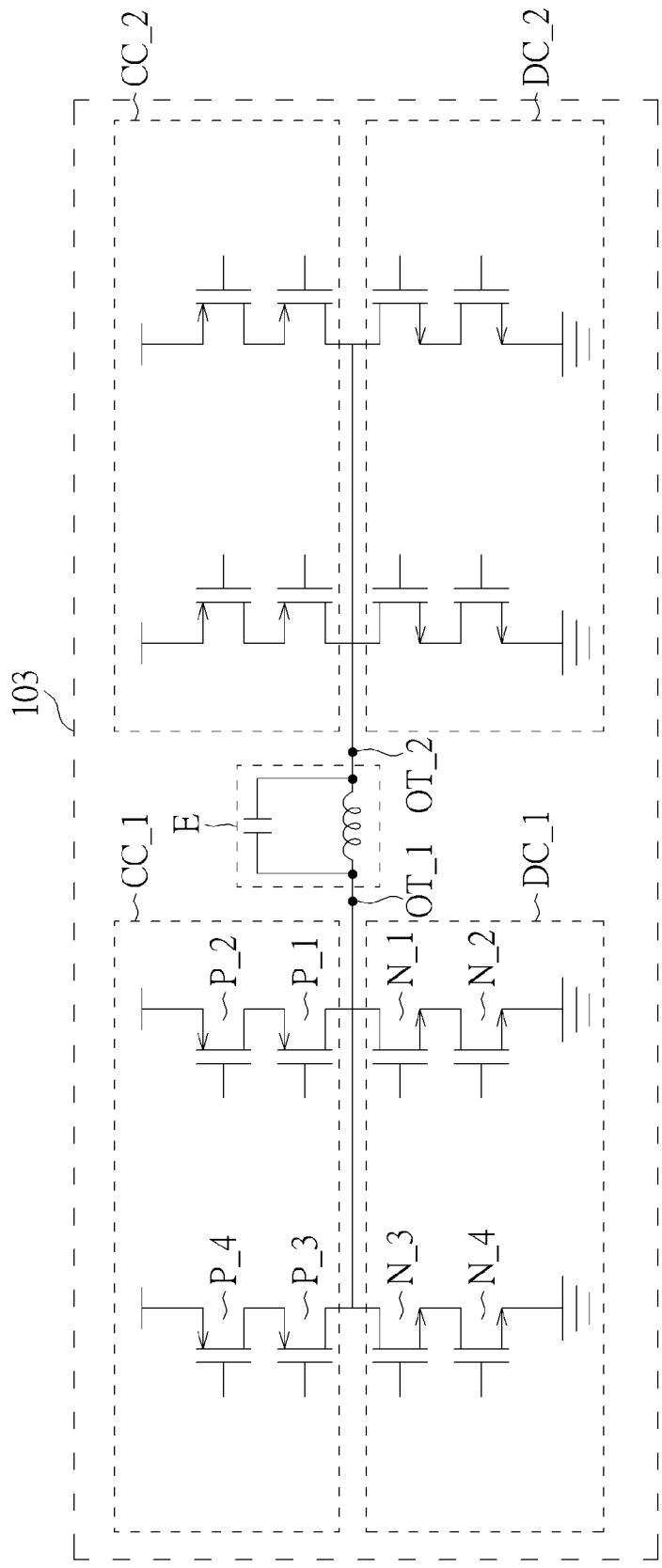
FIG. 15 is a circuit diagram illustrating a circuit for the signal combining module described in FIG. 2, according to another embodiment of the present application.

FIG. 15 is a circuit diagram illustrating a circuit for the signal combining module 103 described in FIG. 1, according to another embodiment of the present application. As shown in FIG. 15, the signal combining module 103 comprises an energy storing circuit E, a charging circuit CC_1 and a discharging circuit DC_1. The energy storing circuit E is coupled to the output terminal OT_1. The charging circuit CC_1 receives at least two of the frequency divided signals to output a charging current to the energy storing circuit E. The discharging circuit DC_1 receives at least two of the frequency divided signals to drain a discharging current from the energy storing circuit E. The energy storing circuit E generates the output combined signal according to the charging current and the discharging current to the output terminal OT_1. The signal combining module 103 can further comprise the charging circuit CC_2 and the discharging circuit DC_2. The structures for the charging circuit CC_2 and the discharging circuit DC_2 are the same as which of the charging circuit CC_1 and the discharging circuit DC_1, thus are omitted for brevity here. Also, the combined output signal generated at the output terminal OT_1 is an inverted signal for the output combined signal generated at the output terminal OT_2.

In one embodiment, the discharging circuit DC_1 comprises a first transistor of first type N_1, a second transistor of first type N_2, a third transistor of first type N_3, and a fourth transistor of first type N_4. Also, the charging circuit CC_1 comprises a first transistor of second type P_1, a second transistor of second type P_2, a third transistor of second type P_3, and a fourth transistor of second type P_4. The detail connections of the transistors are illustrated in FIG. 15, thus are omitted for brevity here.

Figure 16:
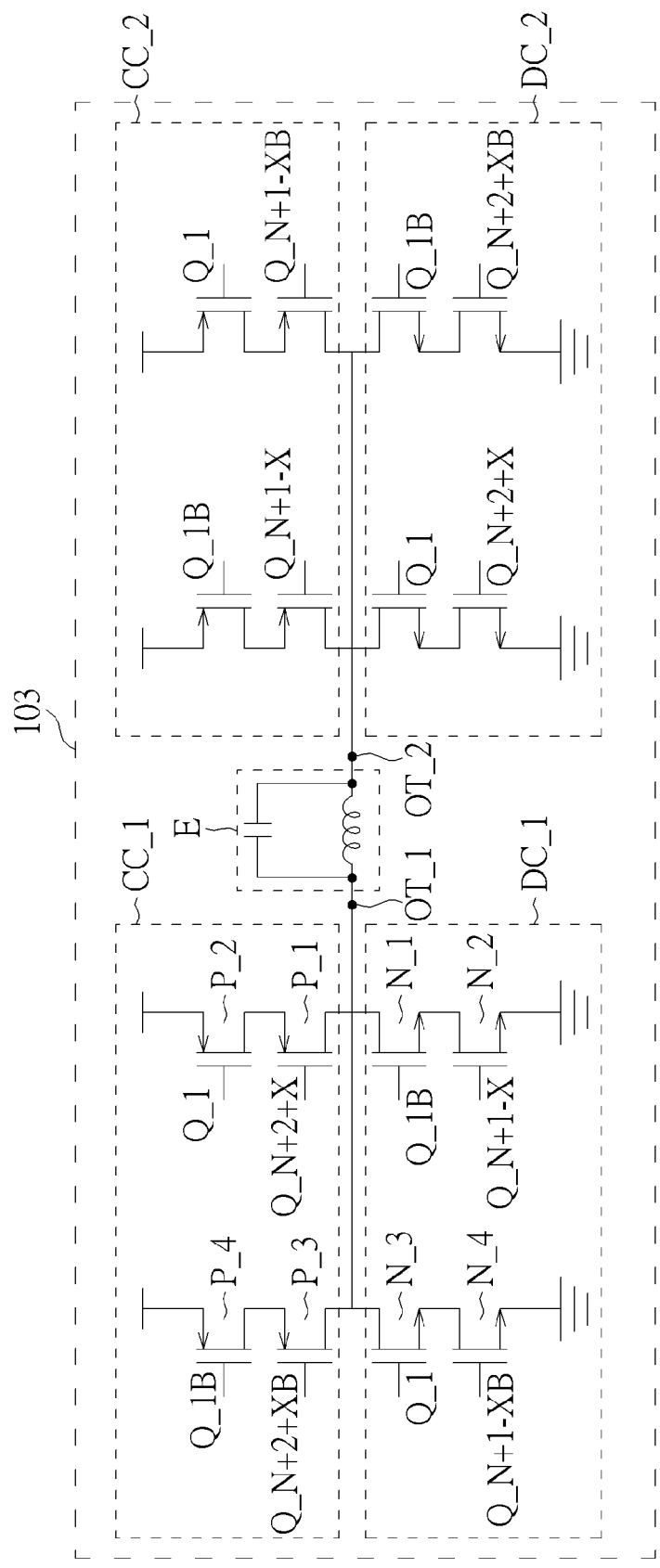
FIG. 16 is an example for the operation of the circuit described in FIG. 15.
Figure 18:
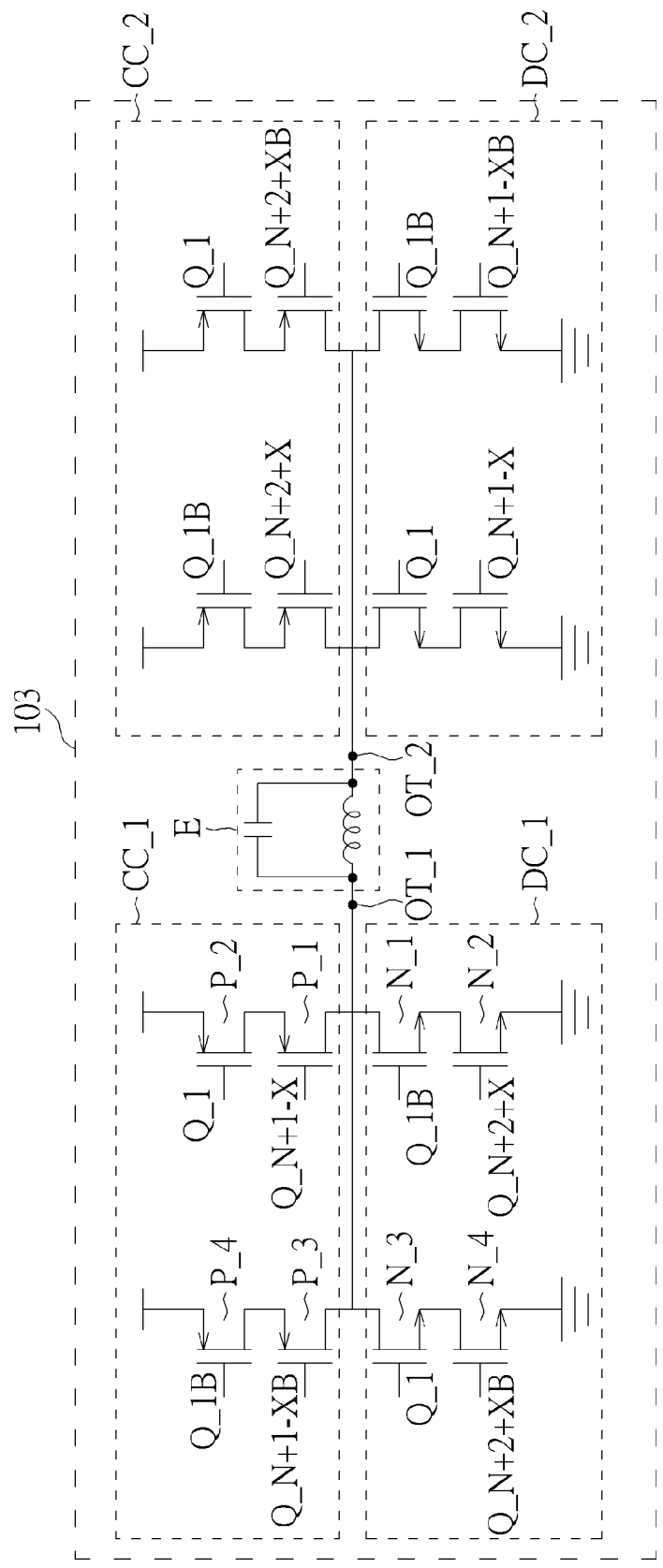
FIG. 18 is an example for the operation of the circuit described in FIG. 15.

FIG. 16 and FIG. 18 are two examples for the operation of the circuit described in FIG. 15. As illustrated in FIG. 16 and FIG. 18, the transistors in the circuit described in FIG. 15 can receive different combinations of frequency divided signals. The definitions of N and M are described in above-mentioned description, thus are omitted for brevity here. However, please note the input for the third transistor of second type P_3 and the fourth transistor of second type P_4 can be swapped for both the embodiments illustrated in FIG. 16 and FIG. 18. Please note the input to other transistors can also be swapped, if the result caused by the swapped input does not change. For example, the inputs for the first transistor of first type N_1 and the second transistor of first type N_2 can be swapped, the inputs for the third transistor of first type N_3 and the fourth transistor of first type N_4 can be swapped, and the input for the first transistor of second type P_1 and the second transistor of second type P_2 can be swapped.

Figure 17:
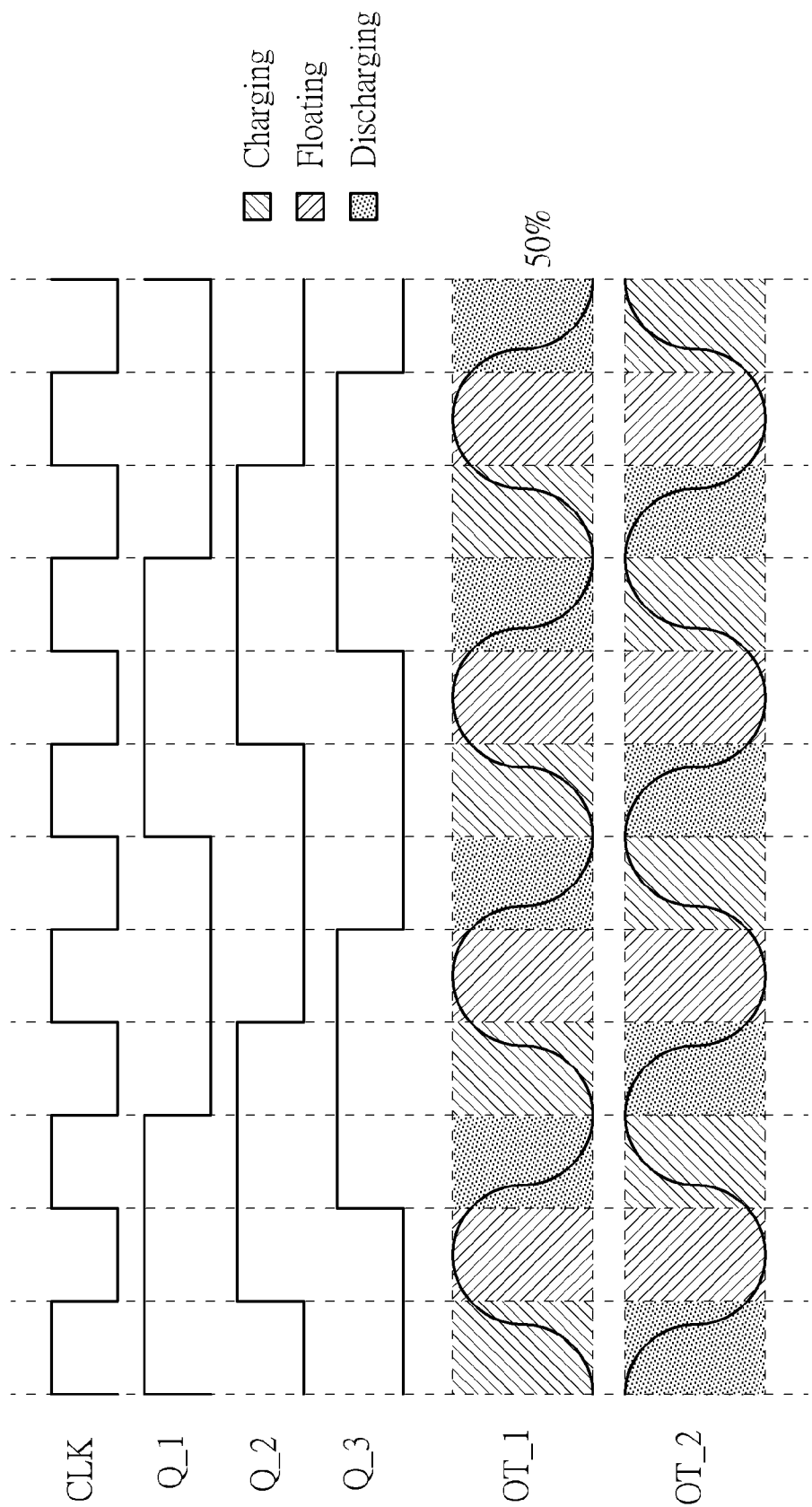
FIG. 17 is a wave chart illustrating the operation of the embodiment described in FIG. 16.
Figure 19:
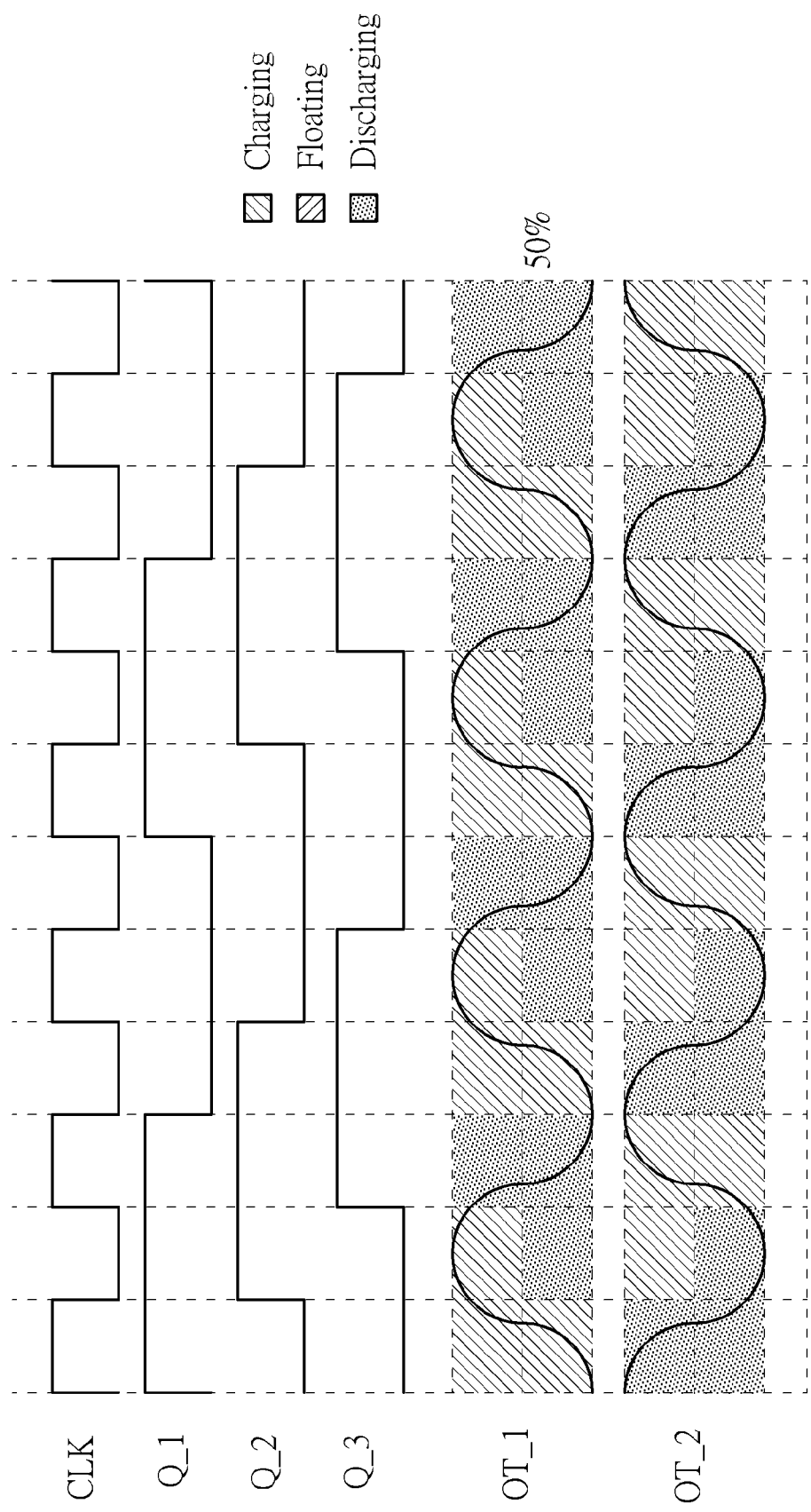
FIG. 19 is a wave chart illustrating the operation of the embodiment described in FIG. 18.

FIG. 17 is a wave chart illustrating the operation of the embodiment described in FIG. 16, and FIG. 19 is a wave chart illustrating the operation of the embodiment described in FIG. 18. In the embodiments of FIG. 17 and FIG. 19, the frequency dividing module having a frequency dividing ratio of 3 and frequency dividing module cooperates with the signal combining module to provide a frequency dividing ratio of 1.5, thus the frequency divided signals comprise Q_1, Q_2 and Q_3, that is, N=1 and X=0. As shown in FIG. 17 and FIG. 19, the output combined signals at the output terminal OT_1 and at the output terminal OT_2 are generated according to the frequency divided signals Q_1, Q_2 and Q_3. In such case, the output combined signal has a duty cycle of 50%, thus can be directly applied as the output signal.

As shown in FIG. 17 and FIG. 19, the embodiments in FIG. 16 and FIG. 18 can operate in different states: a charging state, a discharging state, and a floating state. In the charging state, the first transistor of second type P_1 and the second transistor of second type P_2 are conductive, or, the third transistor of second type P_3 and the fourth transistor of second type P_4 are conductive. In such case, the output terminal OT_1 is charged. Oppositely, in the discharging state, the first transistor of first type N_1 and the second transistor of first type N_2, or, the third transistor of first type N_3 and the fourth transistor of first type N_4 are conductive. In such case the output terminal OT_1 is discharged. In the floating state, the transistors of the charging circuit CC_1, (or plus CC_2) and the discharging circuit DC_1 (or plus DC_2) are controlled to be non-conductive. Corresponding to different input signals, the output combined signal with a 50% duty cycle is generated through different states. For example, in FIG. 17, the output combined signal is generated through three states. However, in FIG. 19, the output combined signal is generated through only two states: the charging state and the discharging state.

Figure 20:
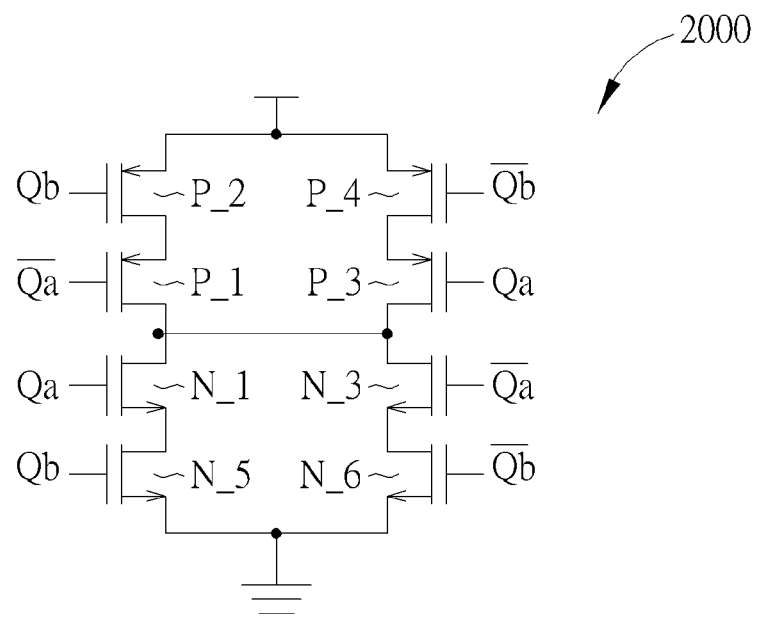
FIG. 20 is a circuit diagram illustrating an XOR circuit applied to the signal combining module of the present application.

Please note the structure for the signal combining module is not limited to FIG. 11 and FIG. 15. For example, an XOR circuit 2000 in FIG. 20 can be applied as the signal combining module. As illustrated in FIG. 20, the XOR circuit 2000 comprises a first transistor of first type N_1, a fifth transistor of first type N_5, a third transistor of first type N_3, a sixth transistor of first type N_6, a first transistor of second type P_1, a second transistor of second type P_2, a third transistor of second type P_3, and a fourth transistor of second type P_4. The connection for the transistors of the XOR circuit 2000 is similar with the first transistor of first type N_1, the third transistor of first type N_3, the fifth transistor of first type N_5, the sixth transistor of first type N_6, the first transistor of second type P_1, the second transistor of second type P_2, the third transistor of second type P_3, and the fourth transistor of second type P_4 in FIG. 11, thus is omitted for brevity here.

Figure 21:
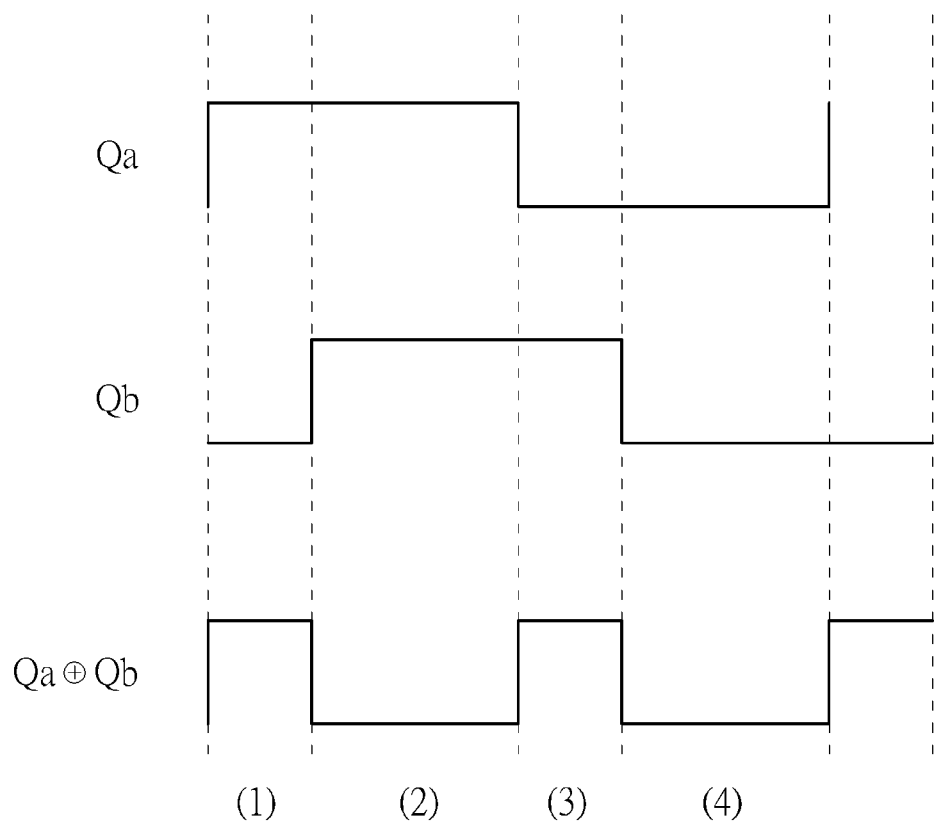
FIG. 21 is a wave chart illustrating the operation for the XOR circuit depicted in FIG. 20.

FIG. 21 is a signal wave form for the XOR circuit 2000. For the period (1), only the first transistor of second type P_1 and the second transistor of second type P_2 are conductive, such that the logic level at the output terminal OT is pulled high. For the period (2), only the first transistor of first type N_1 and the fifth transistor of first type N_5 are conductive, such that the logic level at the output terminal OT is pulled low. For the period (3), only the third transistor of second type P_3 and the fourth transistor of second type P_4 are conductive, such that the logic level at the output terminal OT is pulled high. For the period (4), only the third transistor of first type N_3 and the sixth transistor of first type N_6 are conductive, such that the logic level at the output terminal OT is pulled low.

Based upon above-mentioned embodiments, a signal generating method for generating an output signal with a 50% duty cycle can be acquired. The signal generating method corresponding to FIG. 1 comprises the following steps: (a) generating a plurality of frequency divided signals utilizing a frequency dividing ratio equaling to M, wherein the M is an positive integer; (b) combining at least two of the frequency divided signals to generate at least one output combined signal; and (c) generating the output signal based on the output combined signal. The step (a) cooperates with the step (b) to provide a frequency dividing ratio equaling to N.5, wherein the N is a positive integer.

Also, the signal generating method corresponding to FIG. 2A comprises the following steps: delaying at least one of the frequency divided signal to generate at least one delayed frequency divided signal; and combining at least two of the delayed frequency divided signals, or for combining at least one the frequency divided signal and at least one the delayed frequency divided signal, to generate the output signal. The frequency dividing module cooperates the signal combining module to provide a frequency dividing ratio equaling to N.5, wherein the N is a positive integer.

Other detail steps can be acquired based on above-mentioned embodiments, thus are omitted for brevity here.

In view of above-mentioned embodiments, an output signal with divide-by-N.5 ratio and a 50% duty cycle can be used in IQ divider to generate divide-by-M quadrature signals, where M is odd number, since no phase calibration is used after the IQ divider.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal generating system for generating an output signal with a 50% duty cycle, comprising:
   a frequency dividing module, comprising an odd number of level triggering devices, for generating a plurality of frequency divided signals utilizing a frequency dividing ratio equal to M based on an input signal, wherein M is a positive integer; and
   a signal combining module, for combining at least two of the frequency divided signals, or combining the input signal and one of the frequency divided signals to generate at least one output combined signal;
   wherein the signal generating system generates the output signal based on the output combined signal;
   wherein the frequency dividing module cooperates with the signal combining module to provide a frequency dividing ratio equaling to N.5, wherein N is a positive integer.

2. The signal generating system of claim 1, wherein the signal combining module directly outputs the output combined signal as the output signal.

3. The signal generating system of claim 1, wherein the frequency dividing module comprises M level triggering devices to generate M frequency divided signals, wherein M equals 2*(N.5).

4. The signal generating system of claim 1, further comprising:
   a duty cycle calibrating circuit, for adjusting a duty cycle of the output combined signal to generate the output signal.

5. The signal generating system of claim 4, wherein the duty cycle calibrating circuit comprises:

a comparator, for comparing a duty cycle for the output signal and a duty cycle for an inverted output signal, to generate a comparing result;
a first duty cycle calibrating module, for calibrating a duty cycle of the output signal according to the comparing result; and
a second duty cycle calibrating module, for calibrating a duty cycle for the inverted output signal according to the comparing result.

6. The signal generating system of claim 5,
wherein the first duty cycle calibrating module comprises:
a first falling time tuning circuit, for receiving the output combined signal to generate a first adjusted output combined signal;
a buffer, for buffering the first adjusted output combined signal to generate the output signal;
wherein the second duty cycle calibrating module comprises:
a first inverter, for receiving an inverted output combined signal;
a second falling time tuning circuit, for receiving an output from the first inverter to generate a second adjusted output combined signal; and
a second inverter, for inverting the second adjusted output combined signal to generate the inverted output signal.

7. The signal generating system of claim 6, wherein the first falling time tuning circuit comprises:
a third inverter, receiving the output combined signal;
a transistor of second type, comprising a first terminal coupled to a first voltage level, a second terminal, and a control terminal coupling to an output terminal of the third inverter;
a first transistor of first type, comprising a first terminal coupled to the second terminal of the transistor of second type, a second terminal, and a control terminal coupling to the output terminal of the third inverter;
a second transistor of first type, comprising a first terminal coupled to the second terminal of the first transistor of first type, a second terminal coupled to a second voltage level, and a control terminal.

8. The signal generating system of claim 6, wherein the second falling time tuning circuit comprises:
a fourth inverter, receiving the output from the first inverter;
a transistor of second type, comprising a first terminal coupled to a first voltage level, a second terminal, and a control terminal coupling to an output terminal of the fourth inverter;
a first transistor of first type, comprising a first terminal coupled to the second terminal of the transistor of second type, a second terminal, and a control terminal coupling to the output terminal of the fourth inverter;
a second transistor of first type, comprising a first terminal coupled to the second terminal of the first transistor of first type, a second terminal coupled to a second voltage level, and a control terminal.

9. The signal generating system of claim 5,
wherein the first duty cycle calibrating module comprises:
a first inverter, for receiving the output combined signal;
a second first rising time tuning circuit, for receiving an output from the first inverter to generate a first adjusted output combined signal; and
an second inverter, for inverting the first adjusted output combined signal to generate the output signal;
wherein the second duty cycle calibrating module comprises:

a second rising time tuning circuit, for receiving an inverted output combined signal to generate a second adjusted output combined signal; and
a buffer, for buffering the second adjusted output combined signal to generate the inverted output signal.

10. The signal generating system of claim 5,
wherein the first duty cycle calibrating module comprises:
a first falling time tuning circuit, for receiving the output combined signal to generate a first adjusted output combined signal;
a buffer, for buffering the first adjusted output combined signal to generate the output signal;
wherein the second duty cycle calibrating module comprises:
a first rising time tuning circuit, for receiving an inverted output combined signal to generate a second adjusted output combined signal; and
a buffer, for buffering the second adjusted output combined signal to generate the inverted output signal.

11. The signal generating system of claim 5,
wherein the first duty cycle calibrating module comprises:
a first inverter, for receiving the output combined signal;
a first rising time tuning circuit, for receiving an output from the first inverter of the first duty cycle calibrating module to generate a first adjusted output combined signal; and
a second inverter, for inverting the first adjusted output combined signal to generate the output signal;
wherein the second duty cycle calibrating module comprises:
a third inverter, for receiving an inverted output combined signal;
a first falling time tuning circuit, for receiving an output from the third inverter of the second duty cycle calibrating module to generate a second adjusted output combined signal; and
a fourth inverter, for inverting the second adjusted output combined signal to generate the inverted output signal.

12. The signal generating system of claim 1, wherein the signal combining module comprises an XOR circuit for performing an XOR operation to the output combined signal to generate the output signal.

13. The signal generating system of claim 1, wherein the signal combining module comprises a signal combining module for combining at least two of the frequency divided signals to generate the output combined signal at an output terminal, wherein the signal combining module comprises:
a first initial combining circuit, for receiving a plurality of the frequency divided signals to generate a first output combined signal;
a second initial combining circuit, for receiving a plurality of the frequency divided signals to generate a second output combined signal;
a first edge calibrating device, coupled between a first voltage level and the first initial combining circuit; and
a second edge calibrating device, coupled between a second voltage level and the second initial combining circuit;
wherein the first edge calibrating device and the second edge calibrating device integrate at least one edge of the first output combined signal and the second output combined signal to generate the output combined signal.

14. The signal generating system of claim 13, wherein the first initial combining circuit comprises:

a first transistor of first type, comprising a first terminal coupled to the output terminal, a second terminal, and comprising a control terminal for receiving one of the frequency divided signals;

a second transistor of first type, comprising a first terminal coupled to the second terminal of the first transistor of first type, a control terminal for receiving one of the frequency divided signals and a second terminal coupled to the second voltage level;

a third transistor of first type, comprising a first terminal coupled to the output terminal, a second terminal, and comprising a control terminal for receiving one of the frequency divided signals;

a fourth transistor of first type, comprising a first terminal coupled to the second terminal of the third transistor of first type, a control terminal for receiving one of the frequency divided signals and a second terminal coupled to the second voltage level;

a first transistor of second type, comprising a first terminal, a second terminal coupled to the output terminal, and comprising a control terminal for receiving one of the frequency divided signals;

a second transistor of second type, comprising a second terminal coupled to the first terminal of the first transistor of second type, a control terminal for receiving one of the frequency divided signals and a first terminal coupled to the first edge calibrating device;

a third transistor of second type, comprising a first terminal, a second terminal coupled to the output terminal, and comprising a control terminal for receiving one of the frequency divided signals; and a fourth transistor of second type, comprising a second terminal coupled to the first terminal of the third transistor of second type, a control terminal for receiving one of the frequency divided signals and a first terminal coupled to the first edge calibrating device.

15. The signal generating system of claim 14, wherein the second initial combining circuit comprises the first transistor of first type, the third transistor of first type, the first transistor of second type, the third transistor of second type, wherein the second initial combining circuit further comprises:

a fifth transistor of first type, comprising a first terminal coupled to the second terminal of the first transistor of first type, a control terminal for receiving one of the frequency divided signals, and a second terminal coupled to the second edge calibrating device;

a sixth transistor of first type, comprising a first terminal coupled to the second terminal of the third transistor of first type, a control terminal for receiving one of the frequency divided signals, and a second terminal coupled to the second edge calibrating device;

a fifth transistor of second type, comprising a second terminal coupled to the second terminal of the second transistor of second type, a control terminal for receiving one of the frequency divided signals, and a first terminal coupled to the first voltage level; and a sixth transistor of second type, comprising a second terminal coupled to the second terminal of the fourth transistor of second type, a control terminal for receiving one of the frequency divided signals, and a first terminal coupled to the first voltage level.

16. The signal generating system of claim 14, wherein the first transistor of first type, the second transistor of first type, the third transistor of first type, the fourth transistor of first type are NMOSFETs, wherein the first terminals thereof are drain terminals, the second terminals thereof are source terminals, and control terminals thereof are gate terminals;

wherein the first transistor of second type, the second transistor of second type, the third transistor of second type, the fourth transistor of second type are PMOSFETs, wherein the first terminals thereof are source terminals, the second terminals thereof are drain terminals, and control terminals thereof are gate terminals.

17. The signal generating system of claim 1, wherein the signal combining module comprises a signal combining module for combining two of the frequency divided signals to generate the output combined signal at an output terminal, wherein the signal combining module comprises:

an energy storing circuit, coupled to the output terminal;

a charging circuit, for receiving at least two of the frequency divided signals to output a charging current to the energy storing circuit;

a discharging circuit, for receiving at least two of the frequency divided signals to drain a discharging current from the energy storing circuit;

wherein the energy storing circuit generates the output combined signal according to the charging current and the discharging current to the output terminal.

18. The signal generating system of claim 17, wherein the charging circuit comprises:

a first transistor of first type, comprising a first terminal coupled to the output terminal, a second terminal and a control terminal receiving one of the frequency divided signals;

a second transistor of first type, comprising a first terminal coupled to the second terminal of the first transistor of first type, a second terminal coupled to a second voltage level, and a control terminal receiving one of the frequency divided signals;

a third transistor of first type, comprising a first terminal coupled to the output terminal, a second terminal and a control terminal receiving one of the frequency divided signals;

a fourth transistor of first type, comprising a first terminal coupled to the second terminal of the third transistor of first type, a second terminal coupled to the second voltage level, and a control terminal receiving one of the frequency divided signals.

19. The signal generating system of claim 17, wherein the discharging circuit comprises:

a first transistor of second type, comprising a second terminal coupled to the output terminal, a first terminal and a control terminal receiving one of the frequency divided signals;

a second transistor of second type, comprising a second terminal coupled to the first terminal of the first transistor of second type, a first terminal coupled to a first voltage level, and a control terminal receiving one of the frequency divided signals;

a third transistor of second type, comprising a second terminal coupled to the output terminal, a first terminal and a control terminal receiving one of the frequency divided signals;

a fourth transistor of second type, comprising a second terminal coupled to the first terminal of the third transistor of second type, a first terminal coupled to the first voltage level, and a control terminal receiving one of the frequency divided signals.

20. A signal generating system for generating an output signal with a 50% duty cycle, comprising:

a frequency dividing module, comprising an odd number of level triggering devices, for generating a plurality of frequency divided signals utilizing a frequency dividing ratio equaling to M, wherein the M is a positive integer;

a delay module, for delaying at least one of the frequency divided signals to generate at least one delayed frequency divided signal; and a signal combining module, for combining at least two of the delayed frequency divided signals, or for combining at least one of the frequency divided signals and at least one of the delayed frequency divided signals, to generate the output signal;

wherein the frequency dividing module cooperates with the signal combining module to provide a frequency dividing ratio equaling to N.5, wherein the N is a positive integer.

21. A signal generating method for generating an output signal with a 50% duty cycle, comprising:

(a) generating a plurality of frequency divided signals utilizing a frequency dividing ratio equaling to M based on an input signal, wherein the M is a positive integer;

(b) combining at least two of the frequency divided signals, or combining the input signal and one of the frequency divided signals, to generate at least one output combined signal; and (c) generating the output signal based on the output combined signal;

wherein the step(a) cooperates with the step(b) to provide a frequency dividing ratio equaling to N.5, wherein the N is a positive integer.

22. The signal generating method of claim 21, wherein step (c) directly outputs the output combined signal as the output signal.

23. The signal generating method of claim 21, further comprising adjusting a duty cycle of the output combined signal to generate the output signal.

24. The signal generating method of claim 21, wherein the step (b) comprises:

performing an XOR operation to a plurality of the frequency divided signals to generate a first output combined signal;

performing an XOR operation to a plurality of the frequency divided signals to generate a second output combined signal;

integrating at least one edge of the first output combined signal and the second output combined signal to generate the output combined signal.

25. A signal generating method for generating an output signal with a 50% duty cycle, comprising:

applying a frequency dividing module to generate a plurality of frequency divided signals utilizing a frequency dividing ratio equaling to M, wherein the M is a positive integer;

delaying at least one of the frequency divided signals to generate at least one delayed frequency divided signal; and applying a signal combining module to combine at least two of the delayed frequency divided signals, or applying the signal combining module to combine at least one of the frequency divided signals and at least one of the delayed frequency divided signals, to generate the output signal;

wherein the frequency dividing module cooperates with the signal combining module to provide a frequency dividing ratio equaling to N.5, wherein the N is a positive integer.

* * * * *